(12) United States Patent
Miyagawa et al.

(10) Patent No.: US 10,367,054 B2
(45) Date of Patent: Jul. 30, 2019

(54) SEMICONDUCTOR MEMORY DEVICE

(71) Applicant: TOSHIBA MEMORY CORPORATION, Minato-ku (JP)

(72) Inventors: Hidenori Miyagawa, Yokkaichi (JP); Riichiro Takaishi, Kawasaki (JP); Toshinori Numata, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/699,300

(22) Filed: Sep. 8, 2017

(65) Prior Publication Data
US 2018/0269277 A1 Sep. 20, 2018

(30) Foreign Application Priority Data
Mar. 17, 2017 (JP) .................................. 2017-052821

(51) Int. Cl.
| *H01L 29/04* | (2006.01) |
| *H01L 27/11582* | (2017.01) |
| *H01L 29/36* | (2006.01) |
| *H01L 27/11565* | (2017.01) |
| *H01L 27/11575* | (2017.01) |

(52) U.S. Cl.
CPC ........ *H01L 29/04* (2013.01); *H01L 27/11565* (2013.01); *H01L 27/11582* (2013.01); *H01L 29/36* (2013.01); *H01L 27/11575* (2013.01)

(58) Field of Classification Search
CPC ............. H01L 29/045; H01L 27/11582; H01L 27/11556
See application file for complete search history.

(56) References Cited

U.S. PATENT DOCUMENTS

| 9,123,749 B2 | 9/2015 | Kawai et al. |
| 9,257,552 B2 | 2/2016 | Mizushima |
| 9,806,091 B2 * | 10/2017 | Miyagawa ........ H01L 27/11556 |
| 9,842,856 B2 * | 12/2017 | Okamoto .......... H01L 27/11582 |
| 2007/0063306 A1 * | 3/2007 | Doyle ................. H01L 21/2022 |
| | | 257/486 |
| 2015/0037950 A1 | 2/2015 | Alsmeier et al. |
| 2015/0048292 A1 | 2/2015 | Park |

(Continued)

FOREIGN PATENT DOCUMENTS

| JP | 2014-179465 | 9/2014 |
| JP | 2014-53336 | 3/2015 |
| TW | 201508963 A | 3/2015 |

*Primary Examiner* — Su C Kim
*Assistant Examiner* — David S Wilbert
(74) *Attorney, Agent, or Firm* — Oblon, McClelland, Maier & Neustadt, L.L.P.

(57) ABSTRACT

A semiconductor memory device according to an embodiment comprises a plurality of control gate electrodes, a first semiconductor layer, and a gate insulating layer. The plurality of control gate electrodes are arranged in a first direction that intersects a surface of a substrate. The first semiconductor layer extends in the first direction and faces side surfaces in a second direction intersecting the first direction, of the plurality of control gate electrodes. The gate insulating layer is provided between the control gate electrode and the first semiconductor layer. In addition, the first semiconductor layer includes: a first portion having a first plane orientation; and a second portion having a second plane orientation which is different from the first plane orientation.

19 Claims, 43 Drawing Sheets

(56) References Cited

U.S. PATENT DOCUMENTS

| | | | |
|---|---|---|---|
| 2015/0137259 A1* | 5/2015 | Han | H01L 29/4175 |
| | | | 257/384 |
| 2016/0358933 A1* | 12/2016 | Rabkin | H01L 27/11582 |
| 2017/0025545 A1* | 1/2017 | Nam | H01L 29/78672 |
| 2017/0358591 A1* | 12/2017 | Kim | H01L 27/11551 |

* cited by examiner

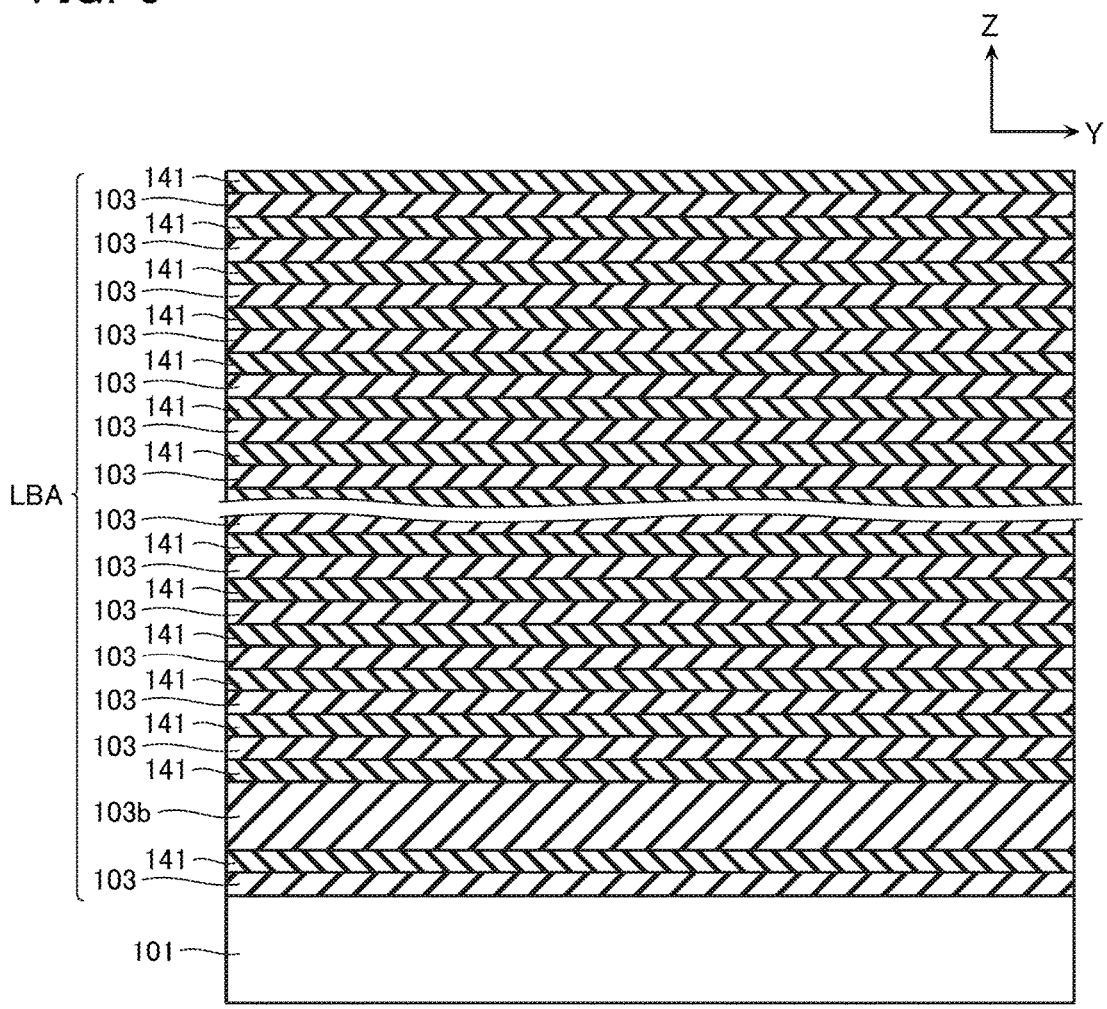

SEMICONDUCTOR MEMORY DEVICE

CROSS-REFERENCE TO RELATED APPLICATIONS

This application is based upon and claims the benefit of Japanese Patent Application No. 2017-052821, filed on Mar. 17, 2017, the entire contents of which are incorporated herein by reference.

BACKGROUND

Field

Embodiments described below relate to a semiconductor memory device.

Description of Related Art

In recent years, a semiconductor memory device in which memory cells are disposed three-dimensionally (a three-dimensional type semiconductor memory device) has been proposed. Such a semiconductor memory device comprises, for example: a plurality of control gate electrodes arranged on a surface of a substrate; a semiconductor layer (a channel body) facing the plurality of control gate electrodes; and a gate insulating layer provided between the control gate electrode and semiconductor layer and capable of accumulating a charge. Thinning of the channel body (semiconductor layer) has been advancing owing to a demand for miniaturization of the semiconductor memory device. However, there is a problem that when the channel is thinned, mobility lowers.

BRIEF DESCRIPTION OF THE DRAWINGS

FIG. 8 is a cross-sectional view for describing a method of manufacturing the semiconductor memory device according to the first embodiment.

DETAILED DESCRIPTION

Figure 1:
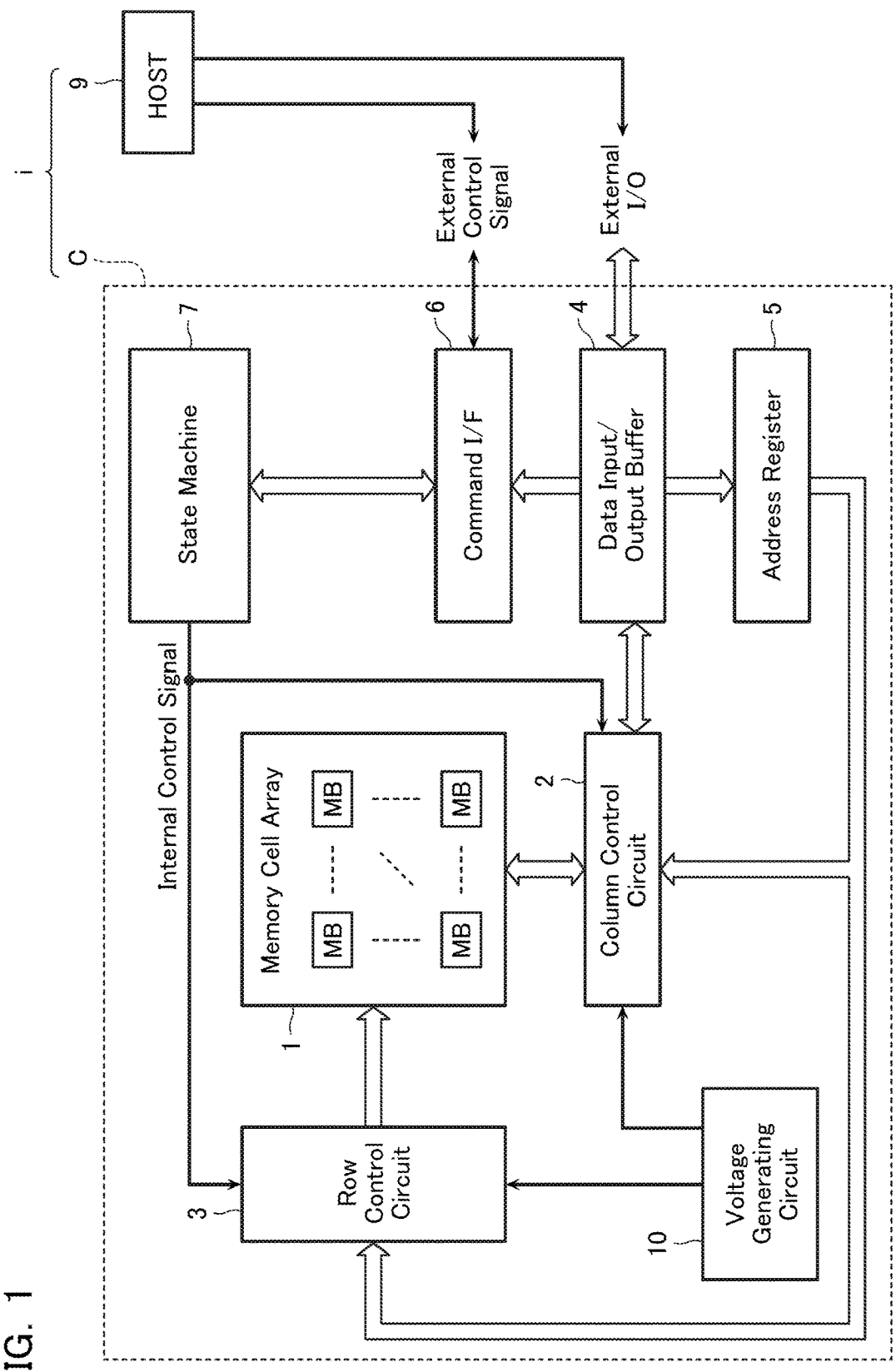
FIG. 1 is a block diagram of a semiconductor memory device according to a first embodiment.

A semiconductor memory device according to an embodiment comprises a plurality of control gate electrodes, a first semiconductor layer, and a gate insulating layer. The plurality of control gate electrodes are arranged in a first direction that intersects a surface of a substrate. The first semiconductor layer extends in the first direction and faces side surfaces in a second direction intersecting the first direction, of the plurality of control gate electrodes. The gate insulating layer is provided between the control gate electrode and the first semiconductor layer. In addition, the first semiconductor layer includes: a first portion having a first plane orientation; and a second portion having a second plane orientation which is different from the first plane orientation.

Next, semiconductor memory devices according to embodiments will be described in detail with reference to the drawings. Note that these embodiments are merely examples, and are not shown with the intention of limiting the present invention.

For example, the semiconductor memory devices described below includes: a plurality of control gate electrodes arranged in a first direction that intersects a surface of a substrate; a semiconductor layer extending in the first direction and facing the above-described plurality of control gate electrodes; and a gate insulating layer provided between these control gate electrode and semiconductor layer.

The above-described control gate electrode may be formed from a metal such as tungsten (W), or may be formed from a semiconductor such as polysilicon.

The above-described semiconductor layer may be connected at its one end (lower end) to a semiconductor substrate, or may be connected to a wiring line configured from the likes of a metal or a semiconductor. Moreover, one ends (lower ends) of two or more of the semiconductor layers may be joined by the likes of a metal or a semiconductor.

The above-described gate insulating layer may include a charge accumulation section. This charge accumulation section may be configured from a charge accumulation layer configured from the likes of a nitride, or may be configured from a floating gate configured from the likes of a semiconductor.

Moreover, in the description below, a direction intersecting the surface of the substrate will be called a first direction, and a direction intersecting the first direction will be called a second direction. In addition, a direction moving away from the substrate along the first direction will be called upward, and a direction moving towards the substrate along the first direction will be called downward. Moreover, when a lower surface is referred to for a certain configuration, this is assumed to mean a surface facing the substrate of this configuration, and when an upper surface is referred to for a certain configuration, this is assumed to mean a surface on an opposite side to the substrate of this configuration. In addition, a direction following the second direction will be called lateral. Moreover, a surface intersecting the second direction will be called a side surface. In addition, a certain direction parallel to the surface of the substrate will be called an X direction, a direction parallel to the surface of the substrate and perpendicular to the X direction will be called a Y direction, and a direction perpendicular to the surface of the substrate will be called a Z direction. Note that the description below exemplifies the case where the first direction corresponds with the Z direction, and the second direction corresponds with the X direction or the Y direction, but the first and second directions need not correspond with the Z direction and the X direction or Y direction.

First Embodiment

[Configuration]

FIG. 1 is a block diagram of a semiconductor memory device according to a first embodiment. Note that the semiconductor memory device referred to here means, for example, the likes of a chip C storing user data or an electronic device i (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device i includes: the chip C; and a host 9 controlling this chip C. The chip C includes: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 includes a plurality of memory blocks MB. These memory blocks MB each record user data. The column control circuit 2 includes an unshown sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
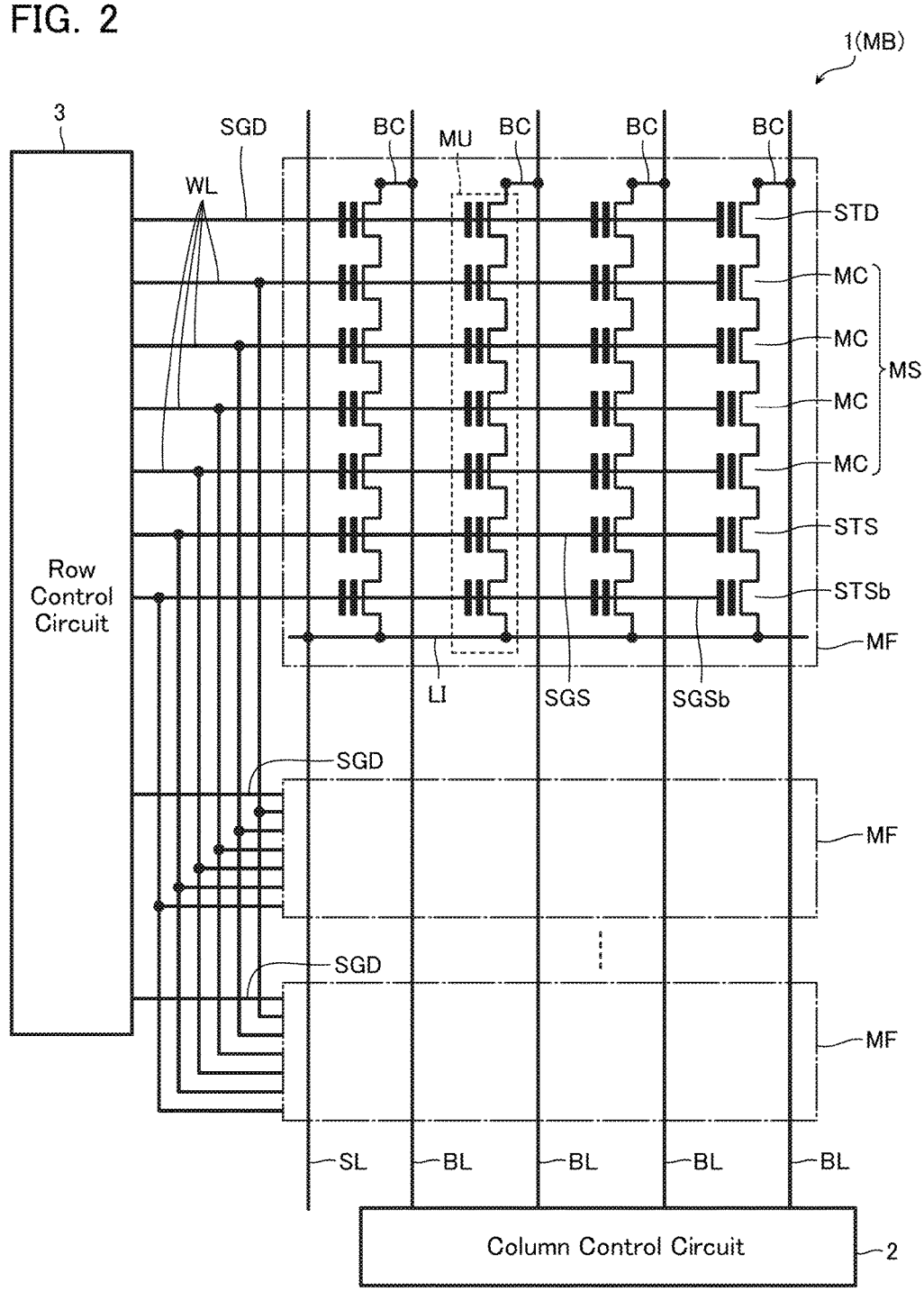
FIG. 2 is a circuit diagram showing a configuration of part of the same semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unshown source line driver via a source line SL. Note that for convenience of description, part of the configuration is omitted in FIG. 2.

The memory block MB includes a plurality of memory fingers MF. The memory finger MF includes a plurality of memory units MU. One ends of these plurality of memory units MU are respectively connected to the bit lines BL via bit line contacts BC. Moreover, the other ends of these plurality of memory units MU are each connected to the source line SL via a common source line contact LI. The memory unit MU includes a drain side select gate transistor STD, a memory string MS, a source side select gate transistor STS, and a lowermost layer source side select gate transistor STSb that are connected in series between the bit line contact BC and the source line contact LI.

The memory string MS includes a plurality of memory cells MC connected in series. The memory cell MC is a field effect transistor that includes: a semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the word lines WL are respectively connected to the control gate electrodes of the plurality of memory cells MC belonging to an identical memory string MS. The word line WL is provided commonly for all of the memory strings MS in the memory block MB.

The drain side select gate transistor STD, the source side select gate transistor STS, and the lowermost layer source side select gate transistor STSb are field effect transistors that include: a semiconductor layer functioning as a channel body; and a control gate electrode. A drain side select gate line SGD is connected commonly to the plurality of drain side select gate transistors STD belonging to an identical memory finger MF. Moreover, a source side select gate line SGS and a lowermost layer source side select gate line SGSb are respectively connected commonly to the control gate electrodes of the pluralities of source side select gate transistors STS and lowermost layer source side select gate transistors STSb that belong to an identical memory block MB.

Note that in the description below, the lowermost layer source side select gate transistor STSb, the source side select gate transistor STS, and the drain side select gate transistor STD will sometimes simply be called select gate transistors (STSb, STS, STD). Moreover, the lowermost layer source side select gate line SGSb, the source side select gate line SGS, and the drain side select gate line SGD will sometimes simply be called select gate lines (SGSb, SGS, SGD).

Figure 3:
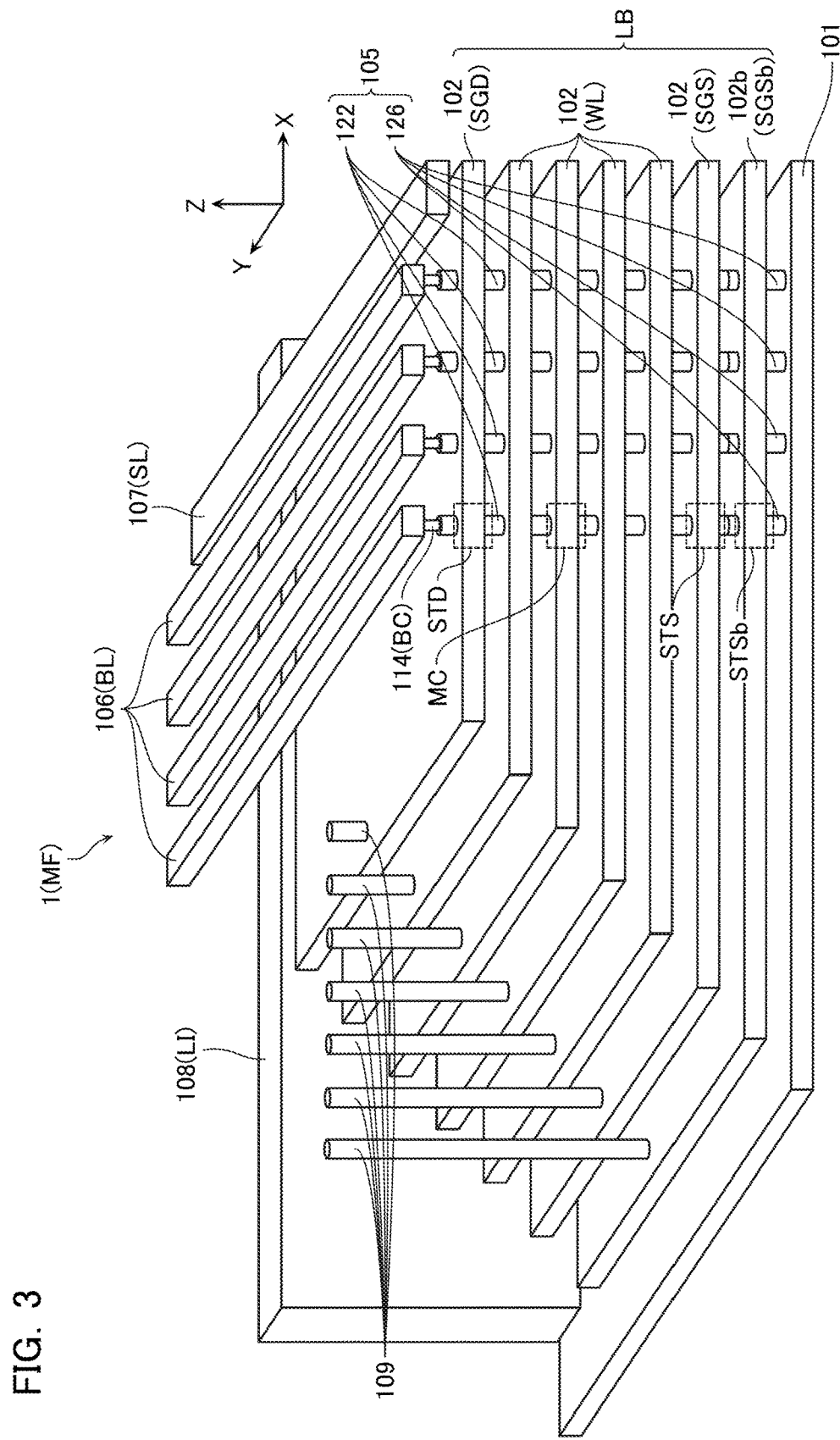
FIG. 3 is a perspective view showing a configuration of part of the same semiconductor memory device.

FIG. 3 is a schematic perspective view showing a configuration of part of the memory finger MF. Note that FIG. 3 describes a three-dimensional structure of the likes of a wiring line or the memory cell MC, and does not show an inter-layer insulating layer provided between the wiring lines, and so on. Moreover, FIG. 3 is shown for description, and a specific configuration may be appropriately changed.

The memory finger MF includes: a substrate 101; a laminated body LB provided above the substrate 101; and a memory columnar body 105 which has a substantially circular column shape and whose side surface is covered by the laminated body LB.

The substrate 101 is a semiconductor substrate configured from the likes of single crystal silicon (Si), for example. The substrate 101 includes, for example, a double well structure that includes an N type impurity layer on a surface of the semiconductor substrate and further includes a P type impurity layer in this N type impurity layer.

The laminated body LB includes a plurality of conductive layers 102 arranged in the Z direction. These conductive layers 102 respectively function as the word line WL and control gate electrode of the memory cell MC, or as the select gate lines (SGSb, SGS, SGD) and control gate electrodes of the select gate transistors (STSb, STS, STD). The conductive layer 102 is configured from a conductive layer of the likes of tungsten (W), for example. The conductive layer 102 extends in the X direction and the Y direction, and has a substantially plate-like shape having longitudinally the X direction. The conductive layers 102 are each connected to the row control circuit 3 (FIGS. 1 and 2) via a contact 109 extending in the Z direction. Note that the contact 109 is configured from a conductive layer of the likes of tungsten (W). Note that in the description below, the most downwardly positioned one (the one closest to the substrate 101) of the plurality of conductive layers 102 will sometimes be called a conductive layer 102b.

The memory columnar body 105 has a circular column shape extending in the Z direction. An intersection of the memory columnar body 105 and the conductive layer 102 functions as the memory cell MC or the select gate transistors (STSb, STS, STD). The memory columnar body 105 includes: a semiconductor layer 122 extending in the Z direction; and a semiconductor layer 126 connected to a lower end section (an end section closest to the substrate 101) of this semiconductor layer 122. The semiconductor layer 122 faces the plurality of conductive layers 102, and functions as a channel body of the memory cell MC and the select gate transistors (STS, STD). The semiconductor layer 126 faces the conductive layer 102b, and functions as a channel body of the lowermost layer source side select gate transistor STSb. A lower end of the semiconductor layer 122 is electrically connected, via the semiconductor layer 126 and the substrate 101, to a conductive layer 108 functioning as the source line contact LI. The conductive layer 108 is electrically connected to the unshown source line driver, via a conductive layer 107 functioning as the source line SL. An upper end of the semiconductor layer 122 is electrically connected to a conductive layer 114 functioning as the bit line contact BC. The conductive layer 114 is electrically connected to the column control circuit 2 (FIGS. 1 and 2) via a conductive layer 106 functioning as the bit line BL. Note that the conductive layer 106, the conductive layer 107, the conductive layer 108, and the conductive layer 114 are configured from a conductive layer of the likes of tungsten (W). Moreover, the conductive layer 106 and the conductive layer 107 are arranged in plurality in the X direction, and extend in the Y direction. The conductive layer 108 includes a substantially plate-like shape extending in the X direction and the Z direction and having longitudinally the X direction, and is connected, at its lower surface, to the substrate 101. The conductive layers 114 extend in the Z direction and are each connected to one semiconductor layer 122 and one conductive layer 106.

Figure 4:
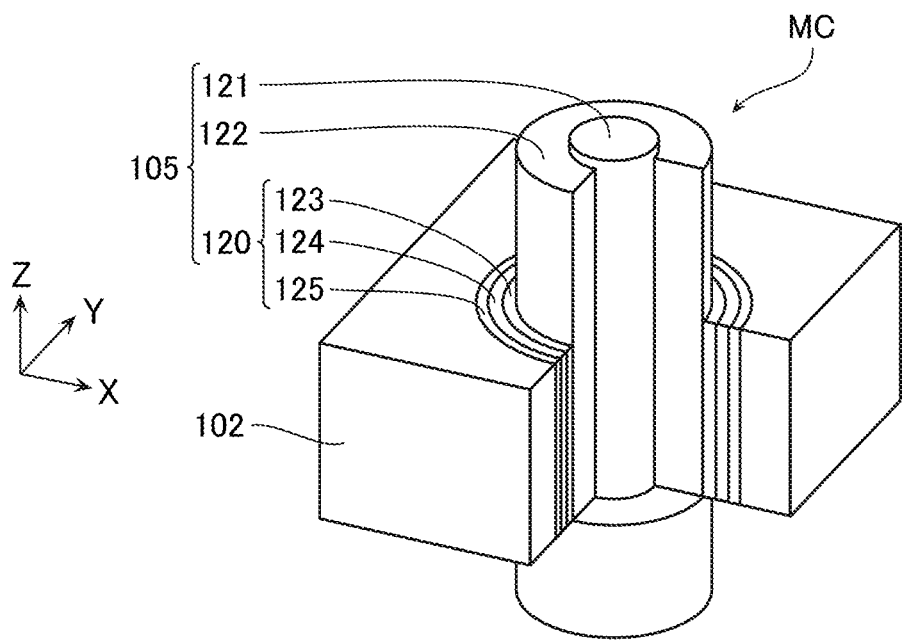
FIG. 4 is a perspective view showing a configuration of part of the same semiconductor memory device.

FIG. 4 is a schematic perspective view showing a configuration of the memory cell MC. Note that FIG. 4 shows the configuration of the memory cell MC, but the select gate transistors (STS, STD) may also be configured similarly to the memory cell MC. Note that in FIG. 4, part of the configuration is omitted.

The memory cell MC is provided at an intersection of the conductive layer 102 and the memory columnar body 105. The memory columnar body 105 includes: a core insulating layer 121 of a circular column shape extending in the Z direction; the semiconductor layer 122 of a substantially cylindrical shape covering a side surface of the core insulating layer 121; and a gate insulating layer 120 of a substantially cylindrical shape covering a side surface of the semiconductor layer 122. The core insulating layer 121 is configured from an insulating layer of the likes of silicon oxide ($SiO_2$), for example. The semiconductor layer 122 is configured from a semiconductor layer of the likes of polysilicon, for example.

The gate insulating layer 120 includes: a tunnel insulating layer 123 covering the side surface of the semiconductor layer 122; a charge accumulation layer 124 covering a side surface of the tunnel insulating layer 123; and a block insulating layer 125 covering a side surface of the charge accumulation layer 124. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example, and configures the charge accumulation section. The block insulating layer 125 is configured from an insulating layer of the likes of silicon oxide ($SiO_2$) or alumina ($Al_2O_3$), for example.

Figure 5:
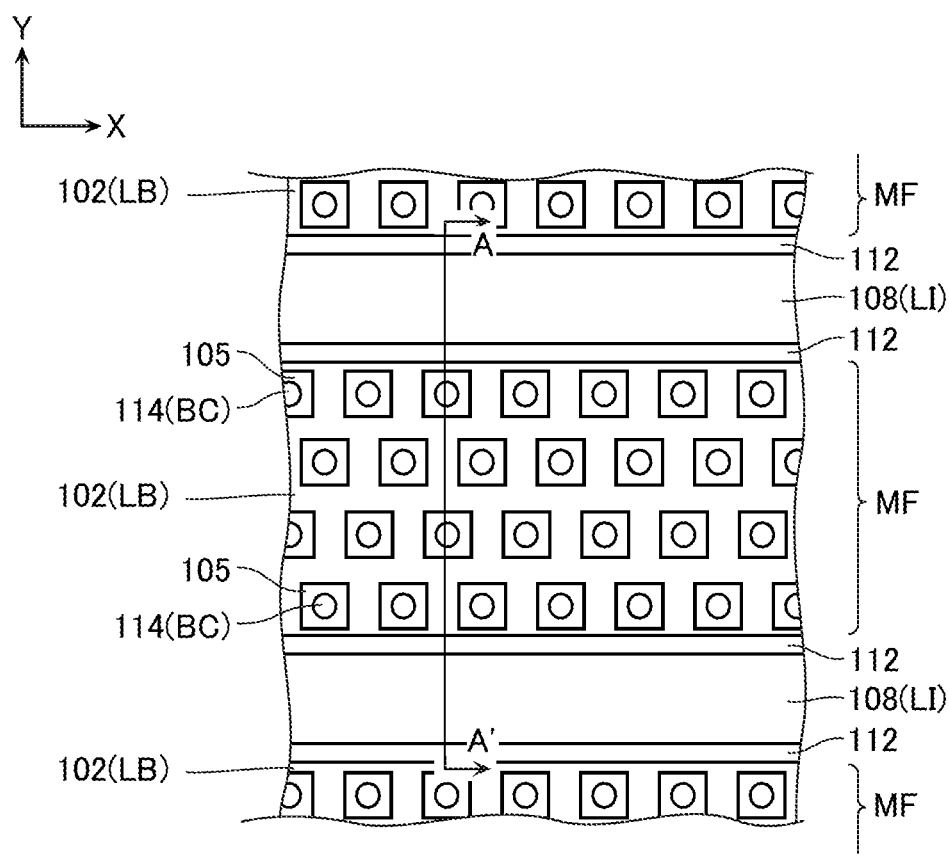
FIG. 5 is a plan view showing a configuration of part of the same semiconductor memory device.
Figure 6:
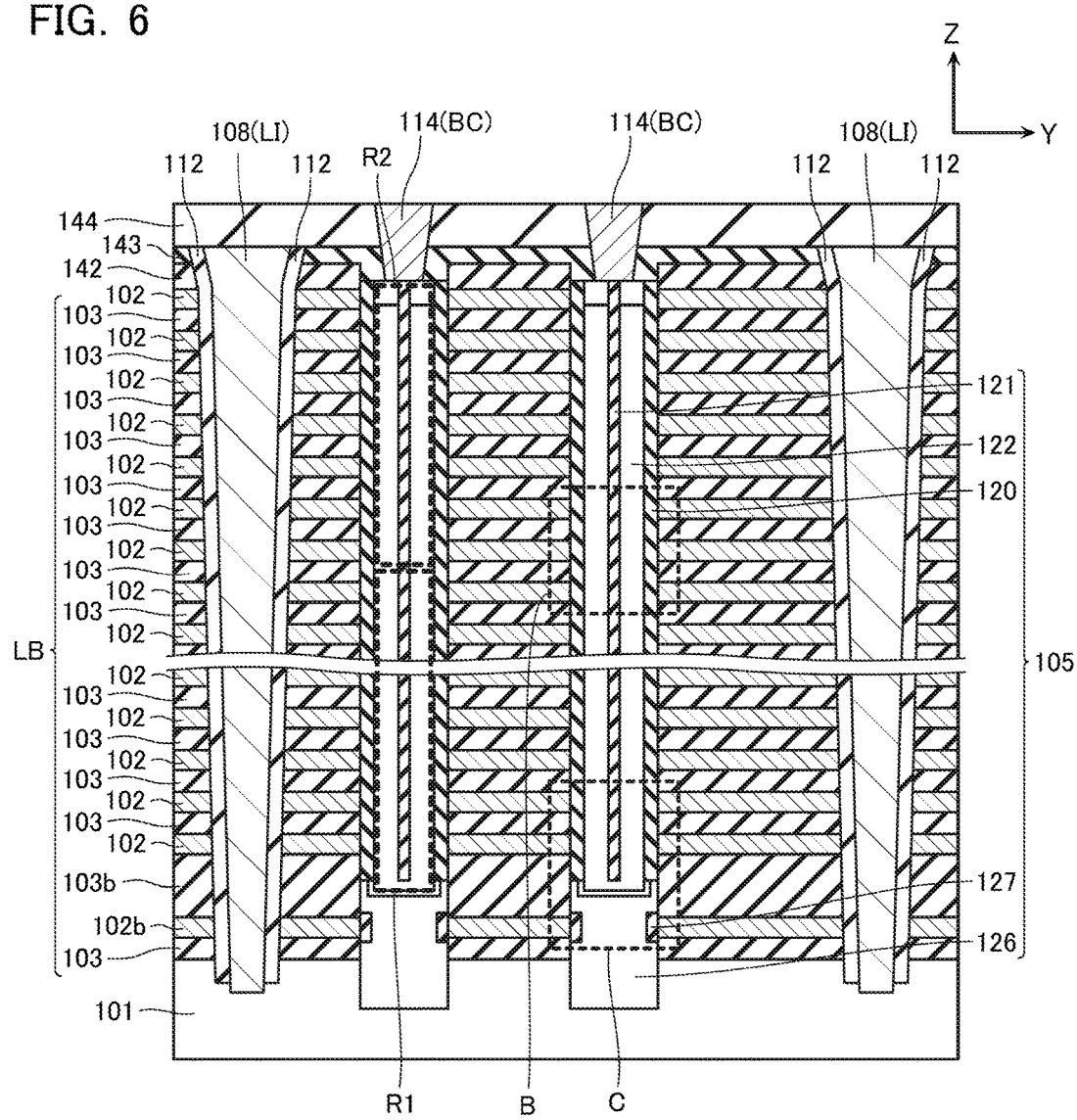
FIG. 6 is a cross-sectional view showing a configuration of part of the same semiconductor memory device.
Figure 7A:
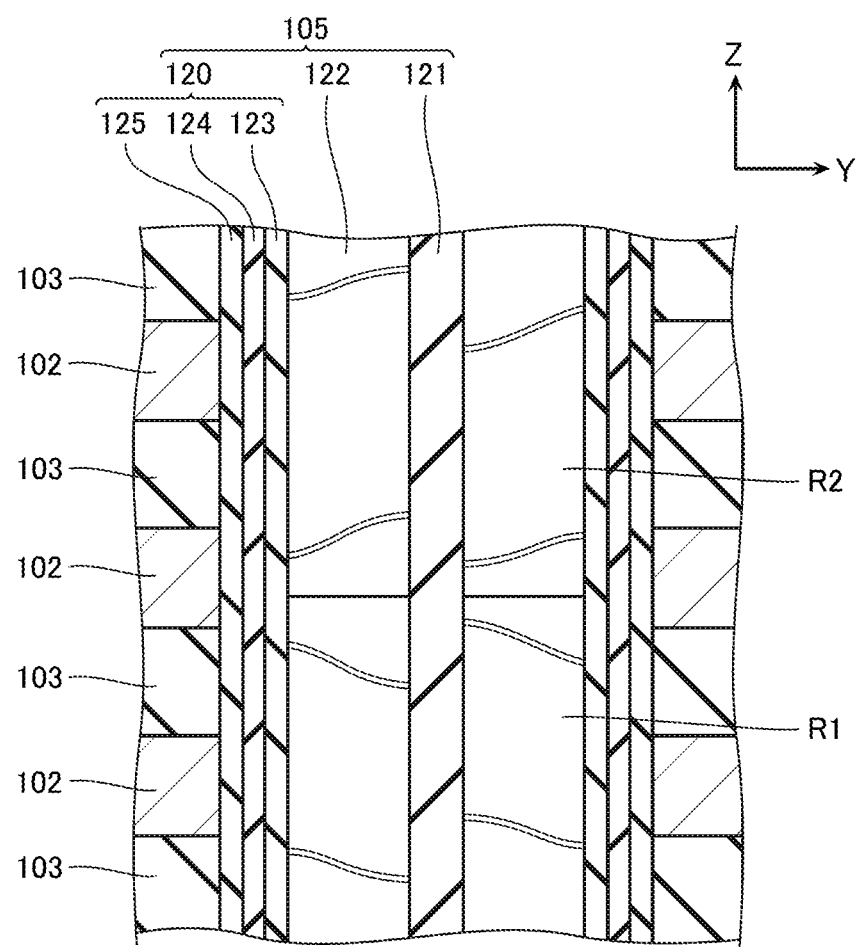
FIG. 7A is an enlarged view of a place indicated by B of FIG. 6.
Figure 7B:
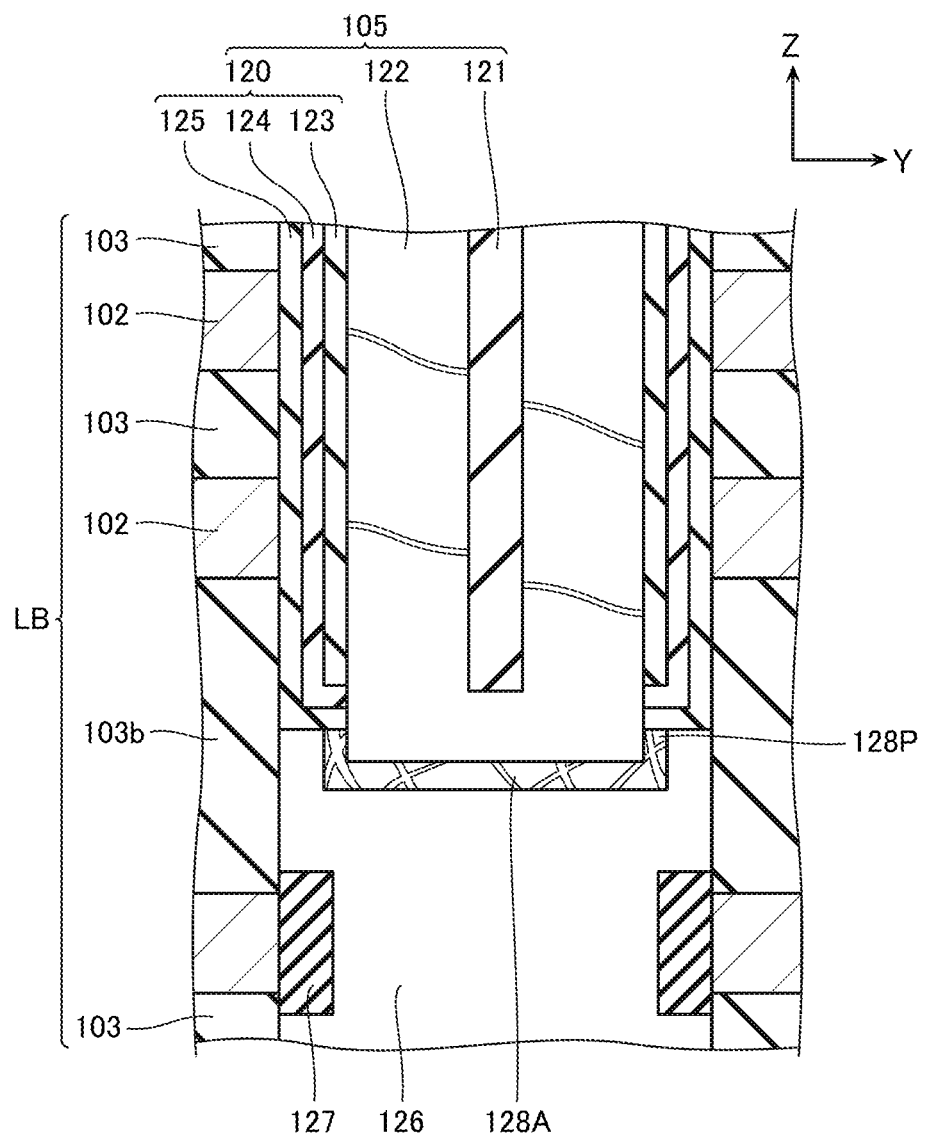
FIG. 7B is an enlarged view of a place indicated by C of FIG. 6.

Next, a configuration of the semiconductor memory device according to the present embodiment will be described in detail using FIGS. 5 to 7B. FIG. 5 is a plan view showing a configuration of part of the same semiconductor memory device. FIG. 6 is a cross-sectional view showing part of the configuration of the same semiconductor memory device, and shows a cross section of a portion indicated by the line A-A' of FIG. 5. FIG. 7A is an enlarged view of a portion indicated by B of FIG. 6, and FIG. 7B is an enlarged view of a portion indicated by C of FIG. 6. Note that in FIGS. 5 to 7B, part of the previously mentioned configuration is sometimes omitted. The same applies also to drawings from FIG. 7B onwards.

As shown in FIG. 5, in the semiconductor memory device according to the present embodiment, a plurality of the memory fingers MF and the conductive layers 108 are arranged alternately along the Y direction. A spacer insulating layer 112 is provided between the memory finger MF and the conductive layer 108. The memory finger MF, the conductive layer 108, and the spacer insulating layer 112 each extend in the X direction. The memory finger MF includes a plurality of the memory columnar bodies 105 arranged staggered.

As shown in FIG. 6, the laminated body LB, in addition to including the plurality of conductive layers 102, includes also the inter-layer insulating layers 103 provided between these conductive layers 102. Moreover, an inter-layer insulating layer 103b provided on an upper surface of the conductive layer 102b is formed more thickly than the other inter-layer insulating layers 103. An upper surface of the laminated body LB is covered by an inter-layer insulating layer 142. The memory columnar body 105 extends in the Z direction penetrating the laminated body LB and the inter-layer insulating layer 142. Upper surfaces of the inter-layer insulating layer 142 and the memory columnar body 105 are covered by an inter-layer insulating layer 143. Moreover, side surfaces in the Y direction of the laminated body LB, the inter-layer insulating layer 142, and the inter-layer insulating layer 143 are covered by the spacer insulating layer 112. In addition, the conductive layer 108 extending in the Z direction is provided between a pair of the laminated bodies LB adjacent in the Y direction. Moreover, upper surfaces of the inter-layer insulating layer 143, the spacer insulating layer 112, and the conductive layer 108 are covered by an inter-layer insulating layer 144. The conductive layer 114 penetrates this inter-layer insulating layer 144 and the inter-layer insulating layer 143 to contact an upper end of the memory columnar body 105. Note that the inter-layer insulating layers 103, 142, 143, and 144, and the spacer insulating layer 112 are configured from an insulating layer of the likes of silicon oxide ($SiO_2$), for example.

The semiconductor layer 126 is provided in a lower end of the memory columnar body 105. The semiconductor layer 126 is embedded in the substrate 101. That is, a lower end of the semiconductor layer 126 is positioned more downwardly than a surface of the substrate 101. An upper end of the semiconductor layer 126 is provided between an upper surface and a lower surface of the inter-layer insulating layer 103b. An insulating layer 127 is provided between the semiconductor layer 126 and the conductive layer 102b. The semiconductor layer 126 is configured from, for example, single crystal silicon whose orientation plane has been aligned with that of the substrate 101. The insulating layer 127 is configured from an insulating layer of the likes of silicon oxide ($SiO_2$), for example, and functions as a gate insulating layer of the lowermost layer source side select gate transistor.

The gate insulating layer 120 is provided on side surfaces of the plurality of conductive layers 102 and inter-layer insulating layers 103 in the laminated body LB. The gate insulating layer 120 covers, at its lower end, an upper surface of the semiconductor layer 126. The lower end of the gate insulating layer 120 is provided between the upper surface and the lower surface of the inter-layer insulating layer 103b.

The semiconductor layer 122 is provided on the side surface of the gate insulating layer 120. The semiconductor layer 122 includes a first portion R1 and a second portion R2. The first portion R1 is a portion extending from an end section on a substrate 101 side, of the semiconductor layer 122 to a central region in the Z direction, of the semiconductor layer 122. The second portion R2 is a portion positioned more upwardly than the first portion R1, of the semiconductor layer 122. That is, the second portion R2 is provided in a position further from the substrate 101 than the first portion R1 is. The first portion R1 and the second portion R2 each face a plurality of the conductive layers 102. The first portion R1 and the second portion R2 have a boundary in the central region of the semiconductor layer 122. Now, the central region of the semiconductor layer 122 means a certain region including a vicinity of a position of a center with respect to an entire length in the Z direction, of the semiconductor layer 122. The reason that the boundary of the first portion R1 and the second portion R2 is positioned in the central region of the semiconductor layer 122 in this way is due to a method of manufacturing by which the semiconductor memory device is manufactured in the present embodiment. Although mentioned in detail later, this central region does not necessarily include a central portion with respect to the entire length in the Z direction of the semiconductor layer 122.

The core insulating layer 121 extends in the Z direction and contacts the first portion R1 and the second portion R2 of the semiconductor layer 122 from the X direction and the Y direction. Moreover, a lower end of the core insulating layer 121 is covered by the first portion R1 of the semiconductor layer 122.

As shown in FIG. 7A, crystal grains included in the semiconductor layer 122 is larger than a film thickness in the Y direction of the semiconductor layer 122. Note that size of a crystal grain referred to here is assumed to mean a maximum value when width has been measured from a plurality of directions for the crystal grain. Moreover, when a certain crystal grain is said to be larger or smaller than a film thickness, this is assumed to mean that "size" of this crystal grain is larger or smaller than the film thickness.

Now, in the present embodiment, plane orientations differ between the first portion R1 and the second portion R2. Note that in the present embodiment, the plane orientation in the first portion R1 and the plane orientation in the second portion R2 are in opposite directions in relation to the Z direction, but a relationship of the plane orientations is never limited to this. Note that plane orientation expresses a direction of a crystal lattice plane, and is generally expressed as a Miller index.

Moreover, in the present embodiment, a boundary portion of the first portion R1 and the second portion R2 of the semiconductor layer 122 sometimes includes a metal atom of the likes of nickel (Ni), cobalt (Co), aluminum (Al), or palladium (Pd).

As shown in FIG. 7B, the polysilicon layer 128A is disposed between the upper end of the semiconductor layer 126 (epitaxial silicon layer 126) and the semiconductor layer 122. In more detail, in the Z direction, the polysilicon layer 128A contacts a recessed section of the upper surface of the epitaxial silicon layer 126 and a lower end of the semiconductor layer 122. Moreover, in the X direction and the Y direction, the polysilicon layer 128A has a projecting section 128P that projects in the Z direction so as to contact each of an inner side surface of the recessed section of the epitaxial silicon layer 126 and a side surface in a vicinity of the lower end of the semiconductor layer 122. The polysilicon layer 128A is configured from polysilicon, for example. Note that a crystal grain of polysilicon is smaller than a crystal grain of epitaxial silicon (single crystal). Therefore, a crystal grain included in the polysilicon layer 128A is smaller than a crystal grain included in the semiconductor layer 122 and the epitaxial silicon layer 126.

Due to the present embodiment, the crystal structure of the semiconductor layer 122 functioning as the channel of the memory cell can be configured as a structure, close to a single crystal structure, in which crystal grains of large grain diameter congregate, hence even better cell characteristics can be achieved.

[Method of Manufacturing]

FIGS. 8 to 24 are cross-sectional views for describing a method of manufacturing the semiconductor memory device according to the present embodiment, and each show a cross section view corresponding to FIG. 6.

As shown in FIG. 8, in the same method of manufacturing, a plurality of the inter-layer insulating layers 103 (including the inter-layer insulating layer 103b) and sacrifice layers 141 are laminated alternately on the substrate 101 to form a laminated body LBA. The sacrifice layer 141 is configured from the likes of silicon nitride ($Si_3N_4$), for example. Deposition of the inter-layer insulating layer 103 and the sacrifice layer 141 is performed by a method such as CVD (Chemical Vapor Deposition), for example.

Figure 9:
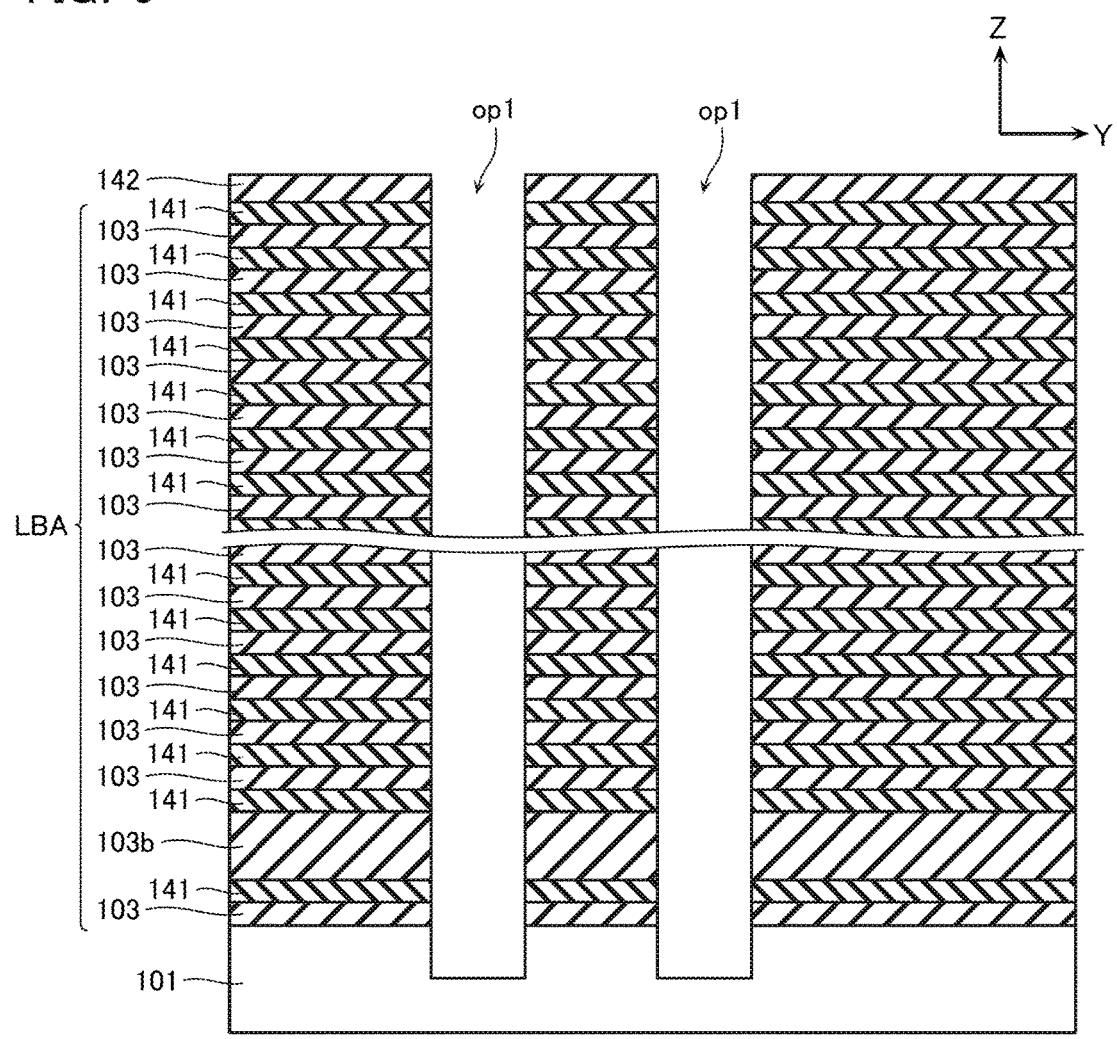
FIG. 9 is a cross-sectional view for describing the same method of manufacturing.

As shown in FIG. 9, an opening op1 is formed in the laminated body LBA. The opening opt is a through hole that extends in the Z direction and penetrates the laminated body LBA to expose a surface of the substrate 101. The opening op1 is formed by, for example, forming on an upper surface of the laminated body LBA the inter-layer insulating layer 142 having an opening in a portion corresponding to the opening opt, and performing RIE (Reactive Ion Etching) using this inter-layer insulating layer 142 as a mask.

Figure 10:
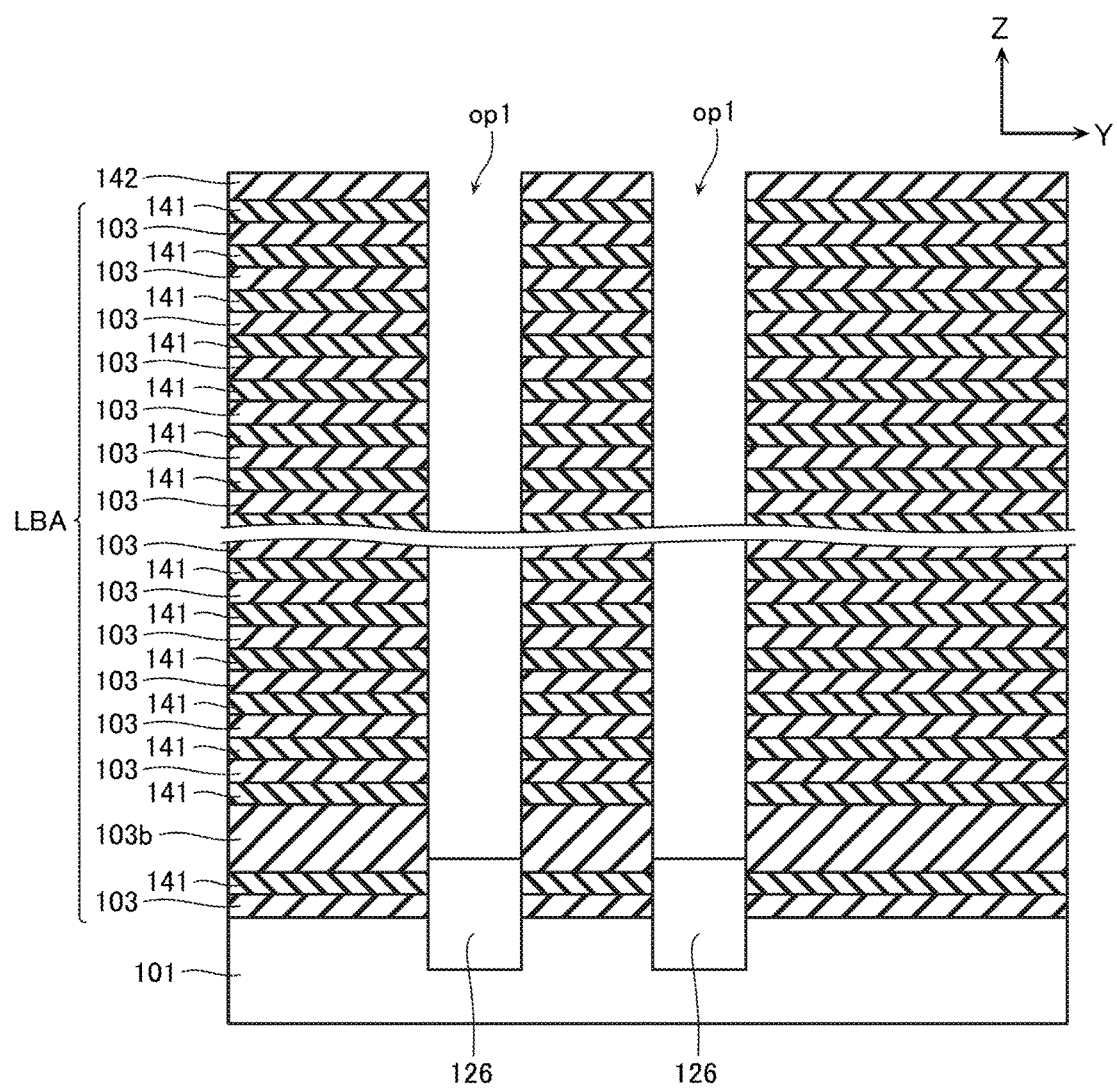
FIG. 10 is a cross-sectional view for describing the same method of manufacturing.

As shown in FIG. 10, the semiconductor layer 126 (epitaxial silicon layer 126) is formed on a bottom surface of the opening opt. The semiconductor layer 126 is formed by, for example, causing the substrate 101 to undergo crystal growth by a method such as an epitaxial growth method. The semiconductor layer 126 is fumed such that a height of its upper surface is between those of the upper surface and the lower surface of the inter-layer insulating layer 103b.

Figure 11:
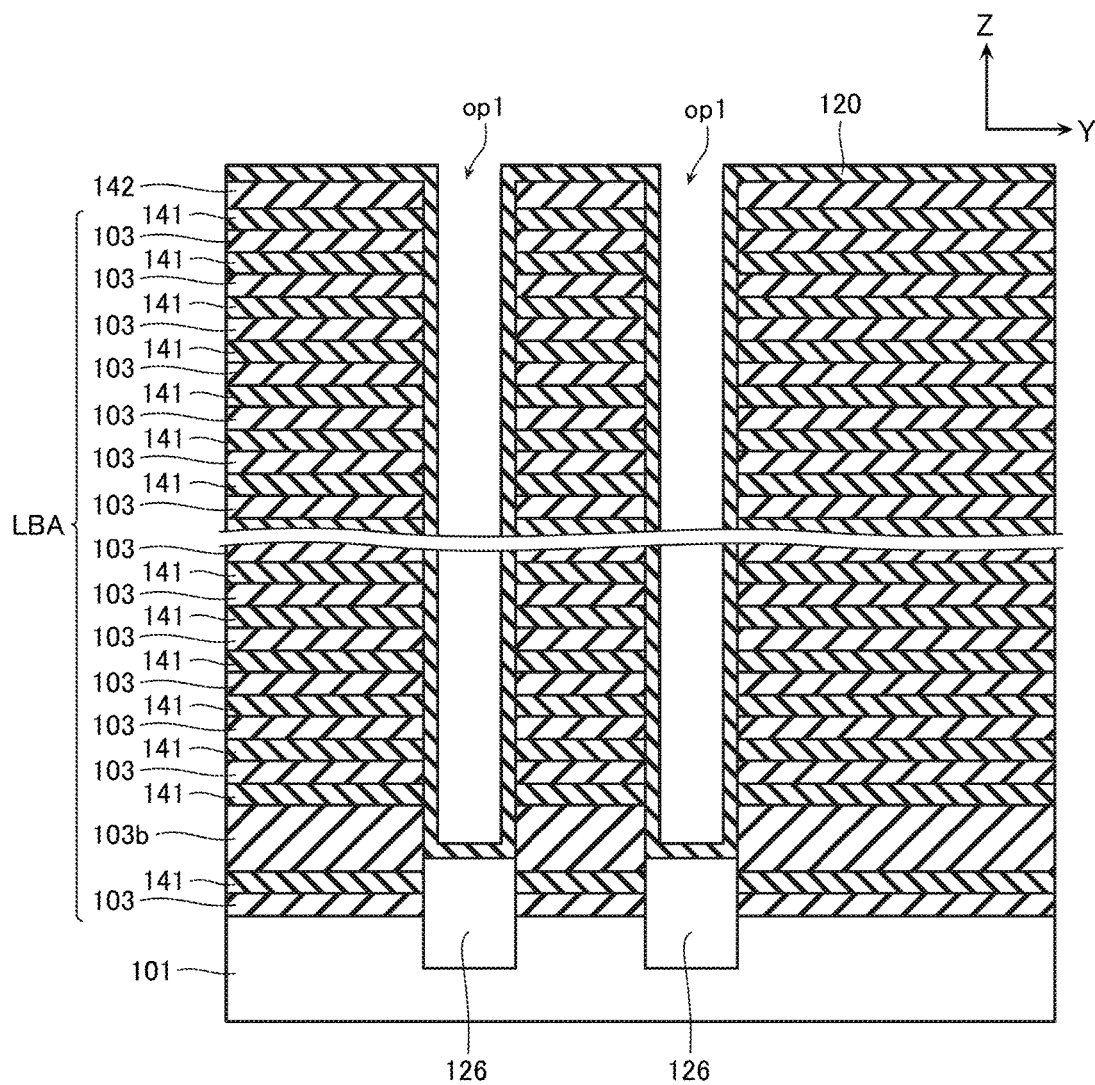
FIG. 11 is a cross-sectional view for describing the same method of manufacturing.

As shown in FIG. 11, the gate insulating layer 120 is deposited on an inside of the opening op1 by a CVD method, for example.

Figure 12:
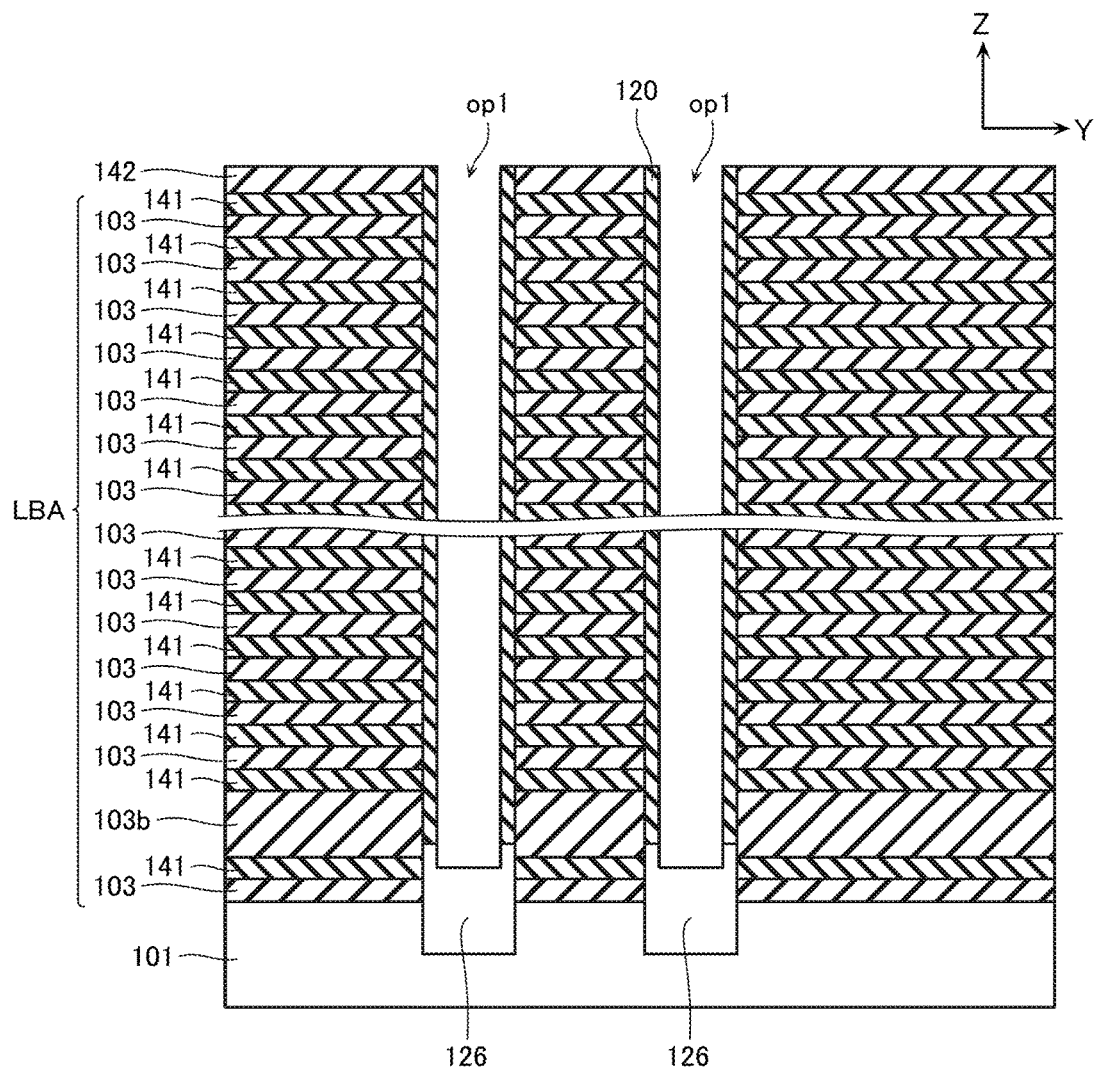
FIG. 12 is a cross-sectional view for describing the same method of manufacturing.

As shown in FIG. 12, a bottom section of the gate insulating layer 120 is removed by the likes of an RIE method, and part of the upper surface of the semiconductor layer 126 is exposed.

Figure 13:
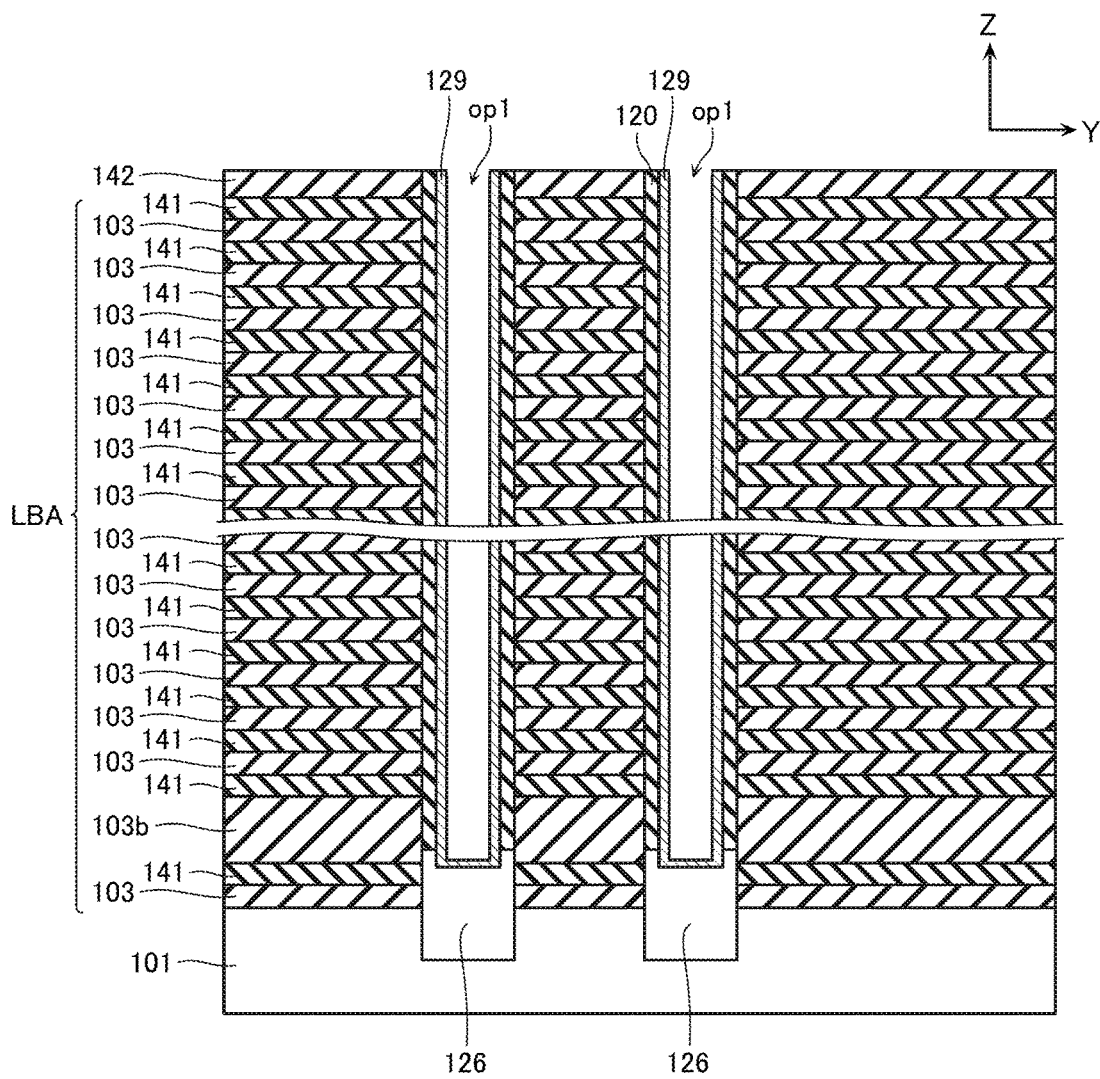
FIG. 13 is a cross-sectional view for describing the same method of manufacturing.

As shown in FIG. 13, a metal layer 129 is deposited on the inside the opening op1. Deposition of the metal layer 129 is performed by PVD (Physical Vapor Deposition) such as sputtering, for example. Regarding a degree of that deposition, the metal layer 129 is preferably deposited at least to a degree that it sufficiently covers the upper surface of the semiconductor layer 126. The metal layer 129 includes nickel (Ni), cobalt (Co), copper (Cu), or palladium (Pd), for example. In the present embodiment, the case where nickel has been selected as the metal will be described.

Figure 14:
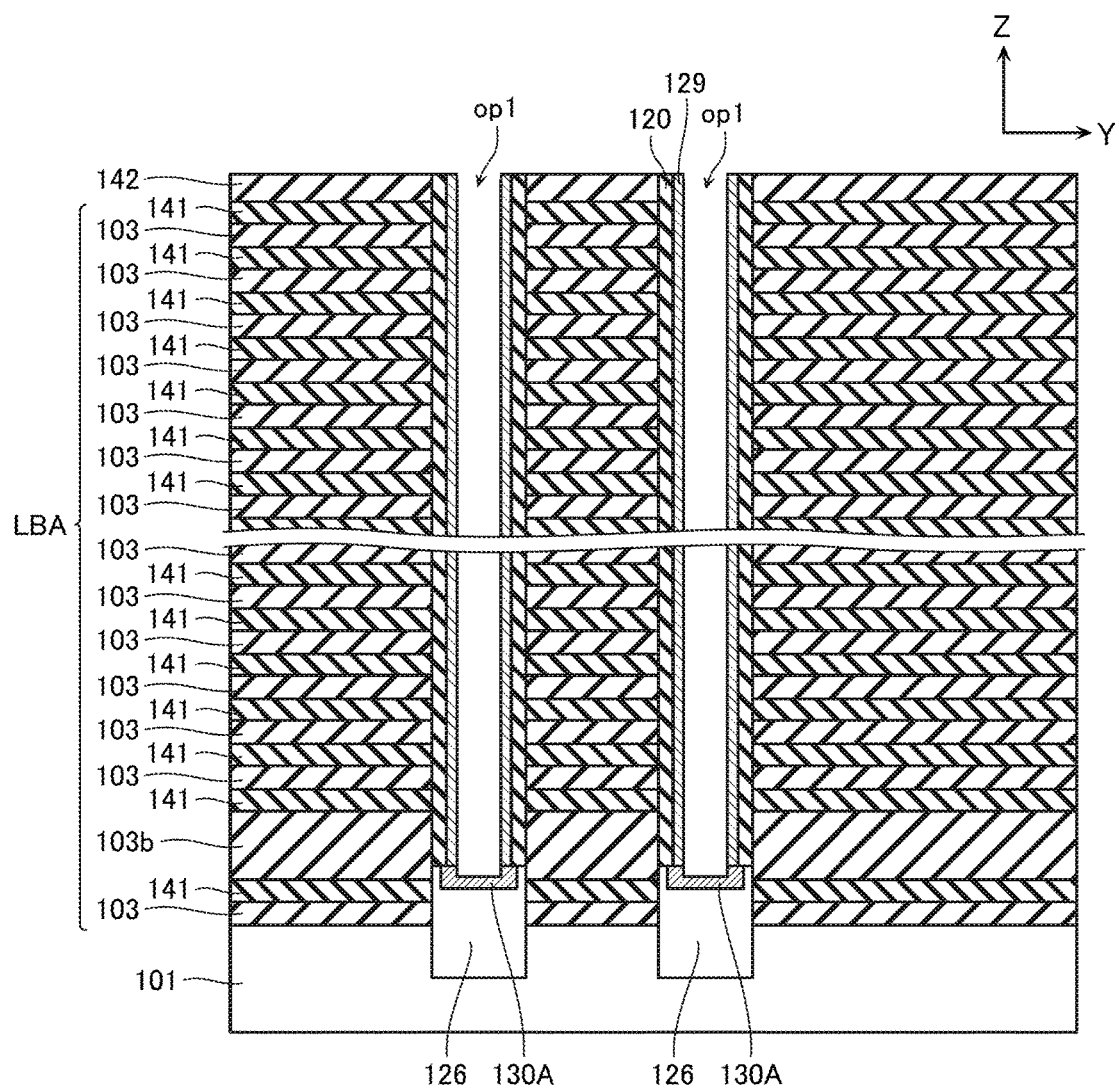
FIG. 14 is a cross-sectional view for describing the same method of manufacturing.

As shown in FIG. 14, heat treatment applied to form a silicide layer 130A. When heat treatment is performed on the metal layer 129, metal atoms in the metal layer 129 diffuse in the semiconductor layer 126, whereby a metal silicide (nickel disilicide in the case of the metal layer 129 being configured from nickel) is formed. The above-described metal is preferably chosen as the metal layer 129, because nickel disilicide has a lattice constant close to that of a crystal structure of silicon. Moreover, because nickel does not react with a silicon oxide film or a silicon nitride film, the metal layer 129 of other than a portion contacting the semiconductor layer 126 never undergoes siliciding and remains unchanged as the metal layer 129.

Figure 15:
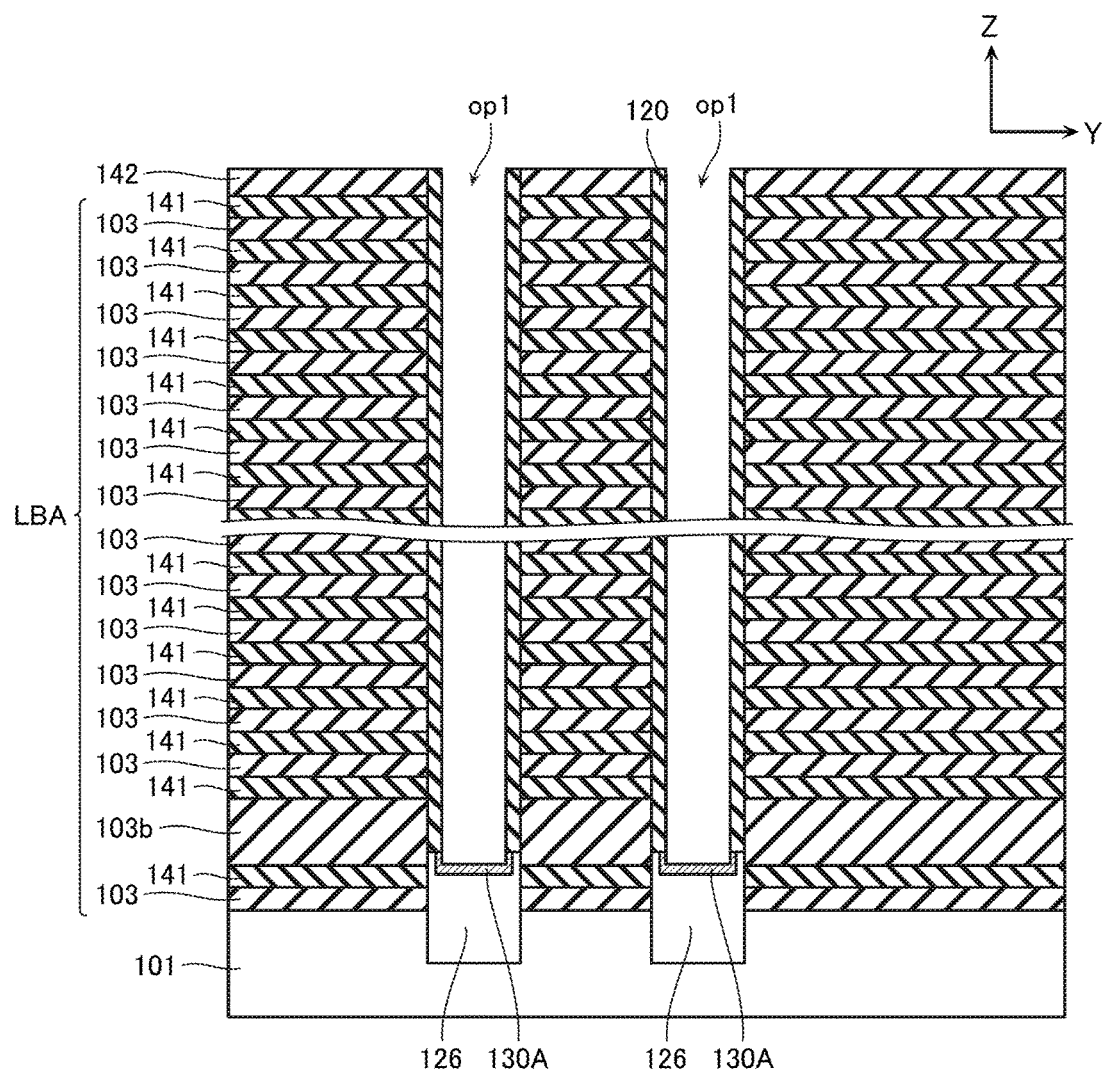
FIG. 15 is a cross-sectional view for describing the same method of manufacturing.

As shown in FIG. 15, the metal layer 129 that has not undergone siliciding in a step of FIG. 14 is removed. This removal is by a means such as wet etching or dry etching.

Figure 16:
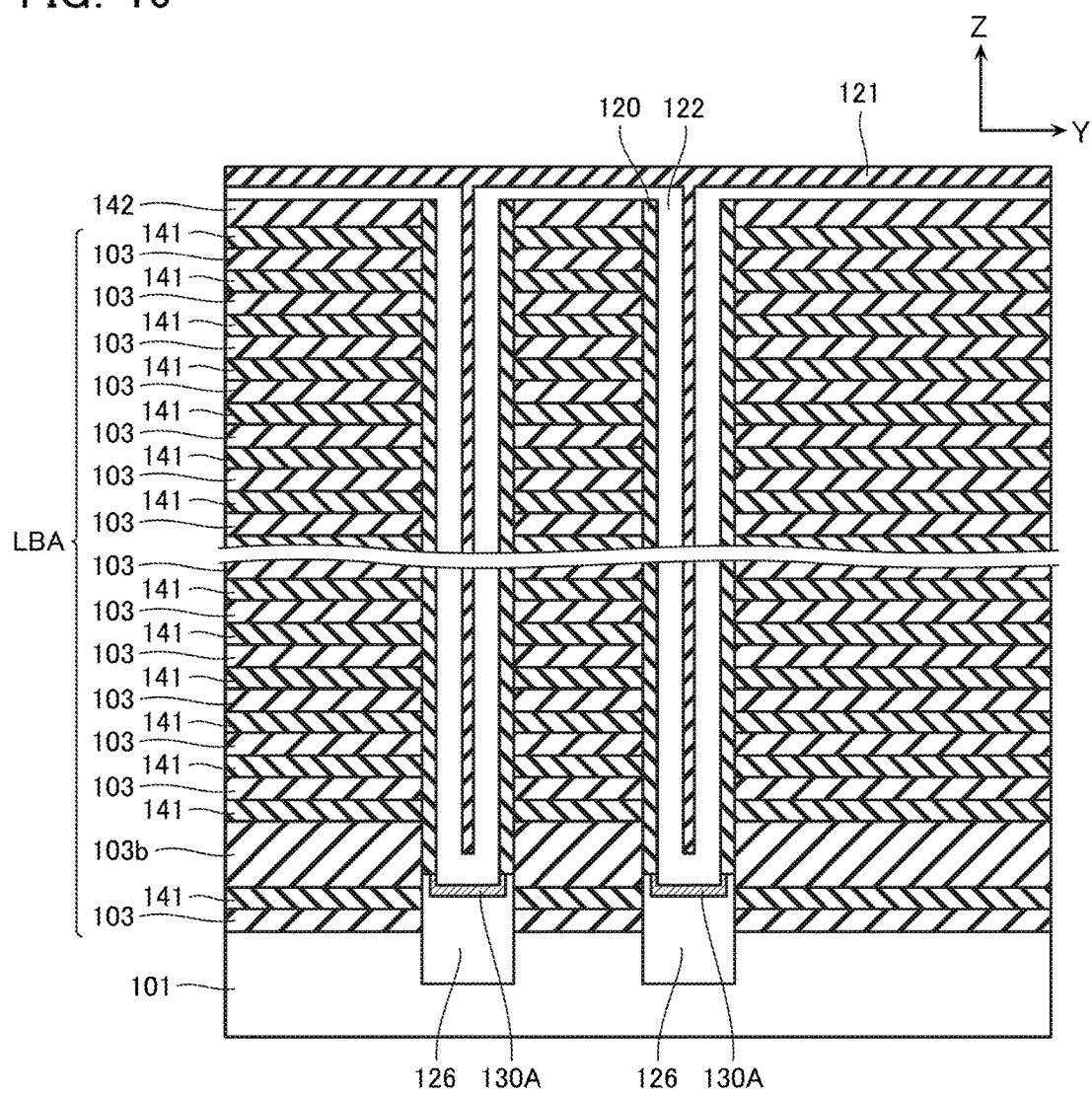
FIG. 16 is a cross-sectional view for describing the same method of manufacturing.

As shown in FIG. 16, the semiconductor layer 122' and the core insulating layer 121 are deposited sequentially, by the likes of a CVD method, on the inside of the opening op1 where the metal layer 129 has been removed. Deposition of the semiconductor layer 122' is performed by, for example, depositing amorphous-state silicon (Si) by a method such as CVD. The core insulating layer 121 is formed by depositing silicon oxide ($SiO_2$) by a method such as CVD.

Figure 17:
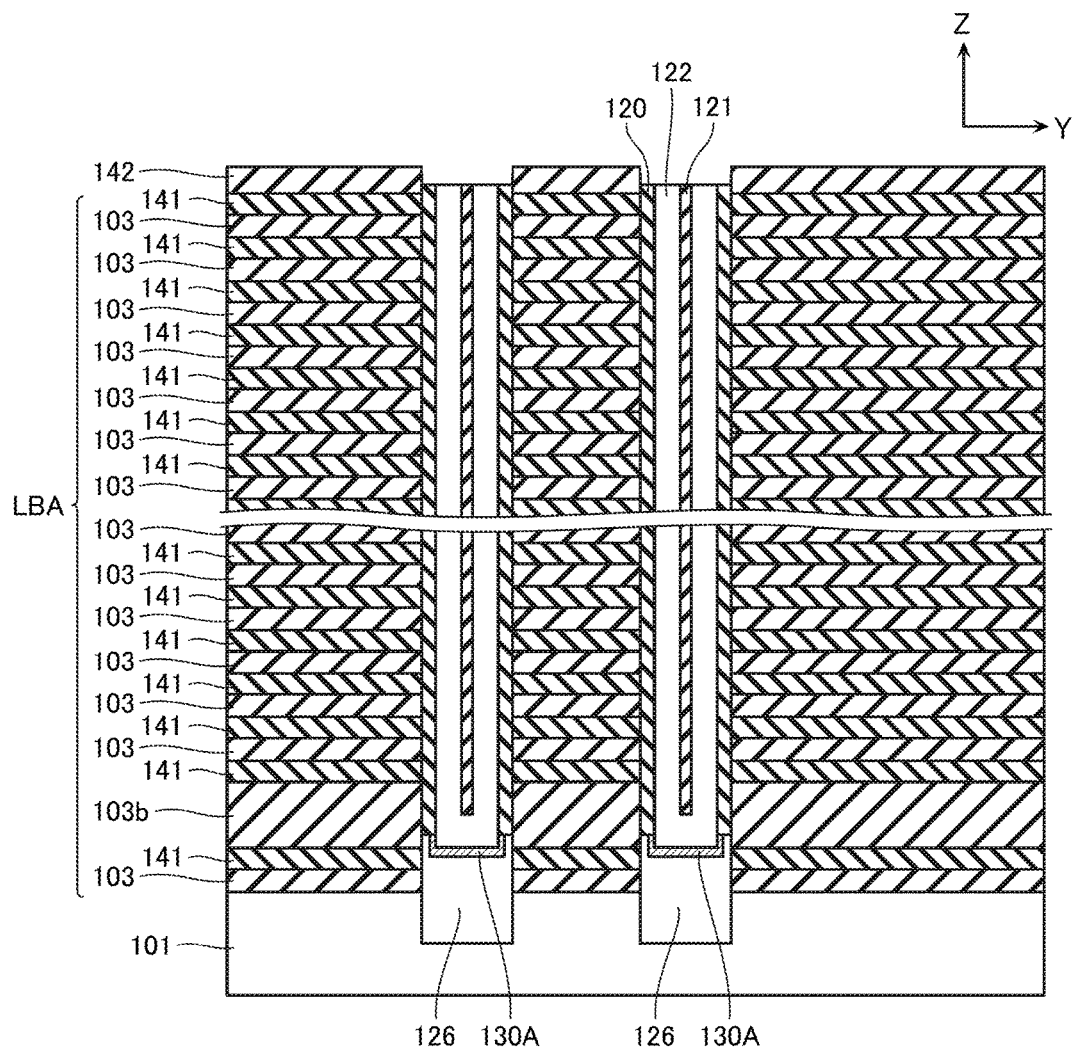
FIG. 17 is a cross-sectional view for describing the same method of manufacturing.

As shown in FIG. 17, the semiconductor layer 122' and the core insulating layer 121 covering an upper surface of the inter-layer insulating layer 142 are removed by etching.

Figure 18:
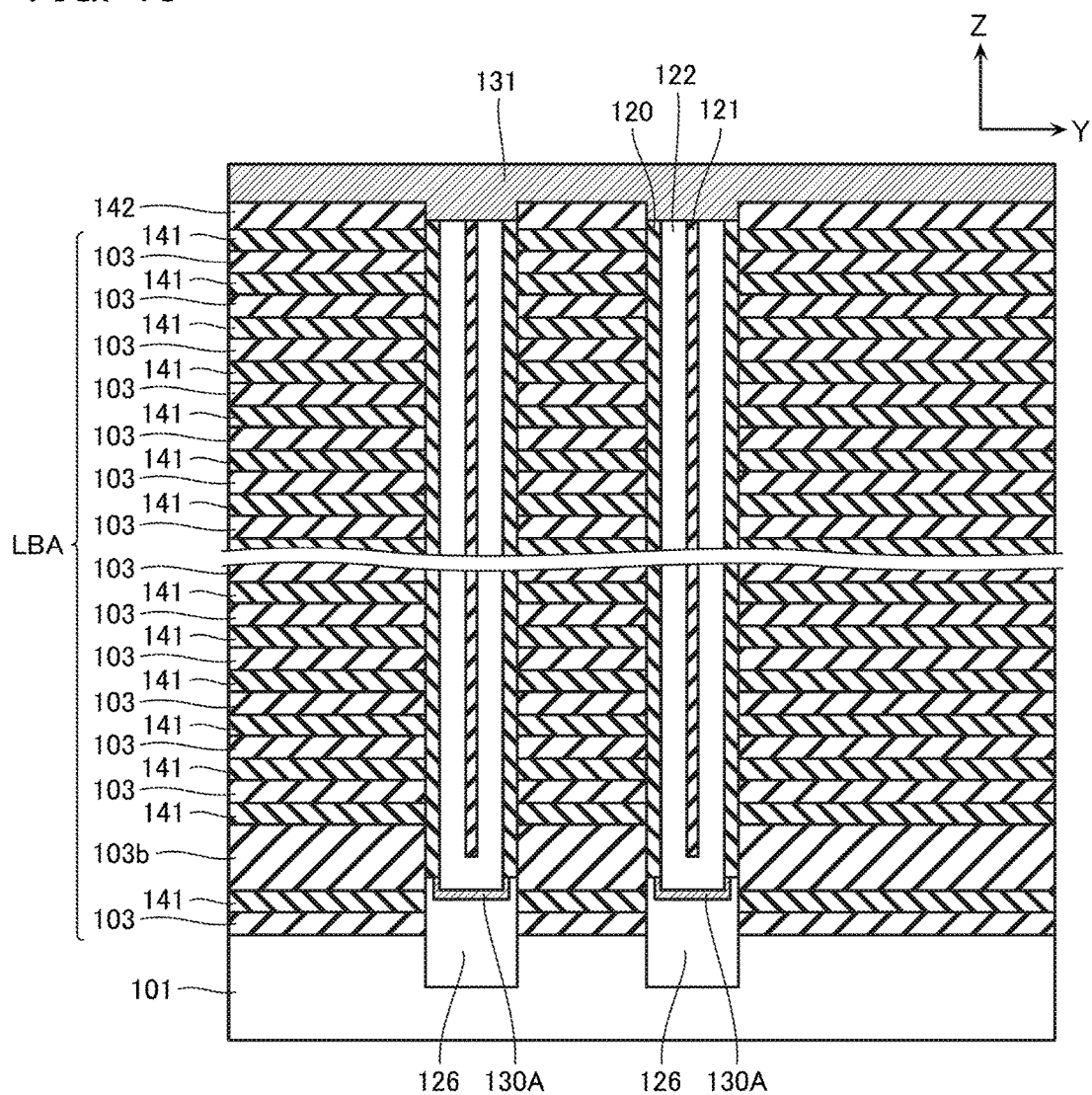
FIG. 18 is a cross-sectional view for describing the same method of manufacturing.

As shown in FIG. 18, a metal layer 131 is deposited on upper surfaces of the core insulating layer 121, the semiconductor layer 122', the gate insulating layer 120, and the inter-layer insulating layer 142. Deposition of the metal layer 131 is performed similarly to deposition of the metal layer 129. Moreover, although it is possible for the metal layer 131 to use a similar kind of metal to in the metal layer 129, the metal layer 131 preferably employs the same kind of metal as in the metal layer 129.

Figure 19:
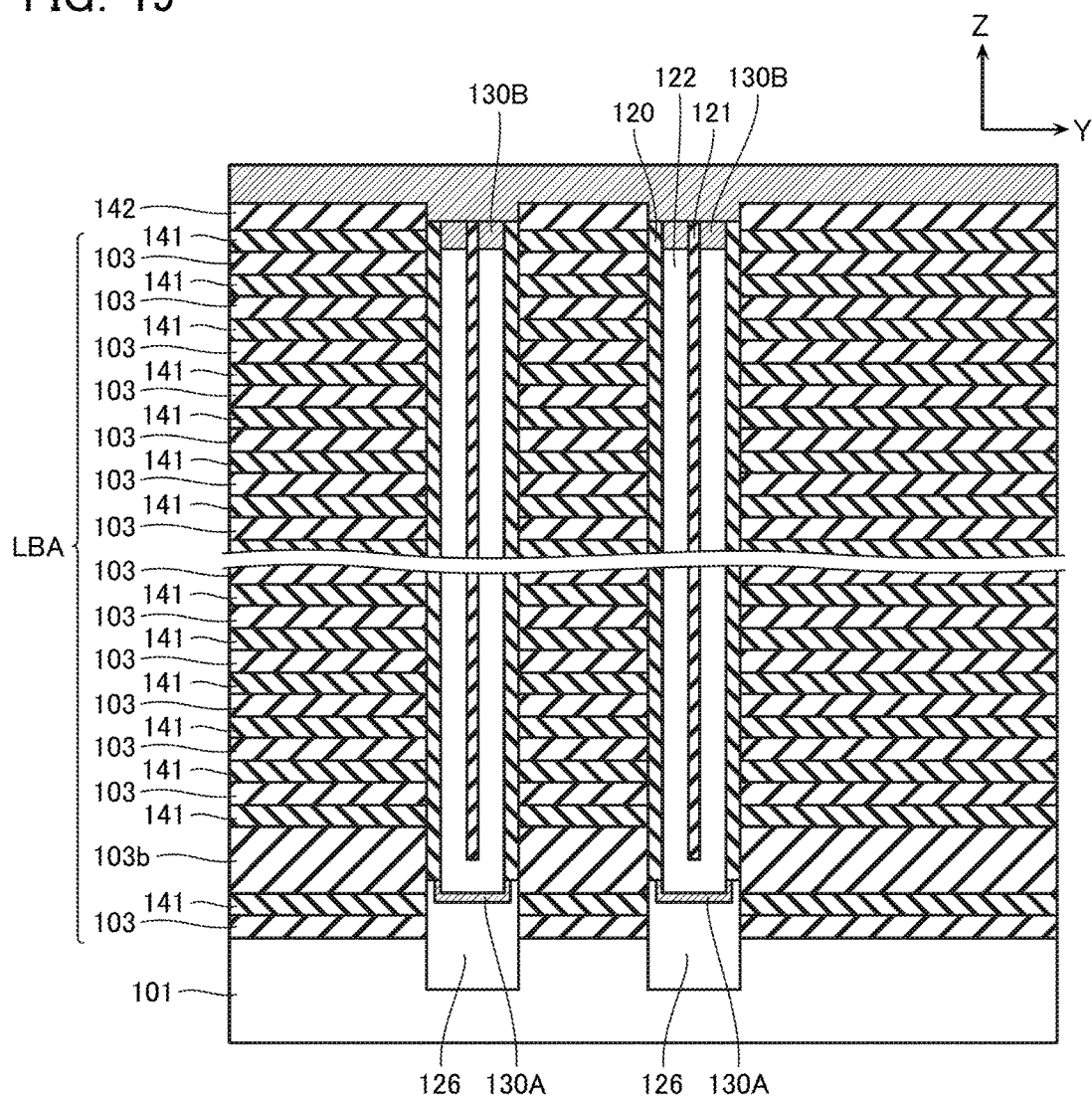
FIG. 19 is a cross-sectional view for describing the same method of manufacturing.

As shown in FIG. 19, heat treatment is performed again, and a silicide layer 130B is formed in an upper section of the semiconductor layer 122'. In this case also, only a portion contacting the semiconductor layer 122, of the metal layer 131 undergoes siliciding, and other portions of the metal layer 131 remain unreacted.

Figure 20:
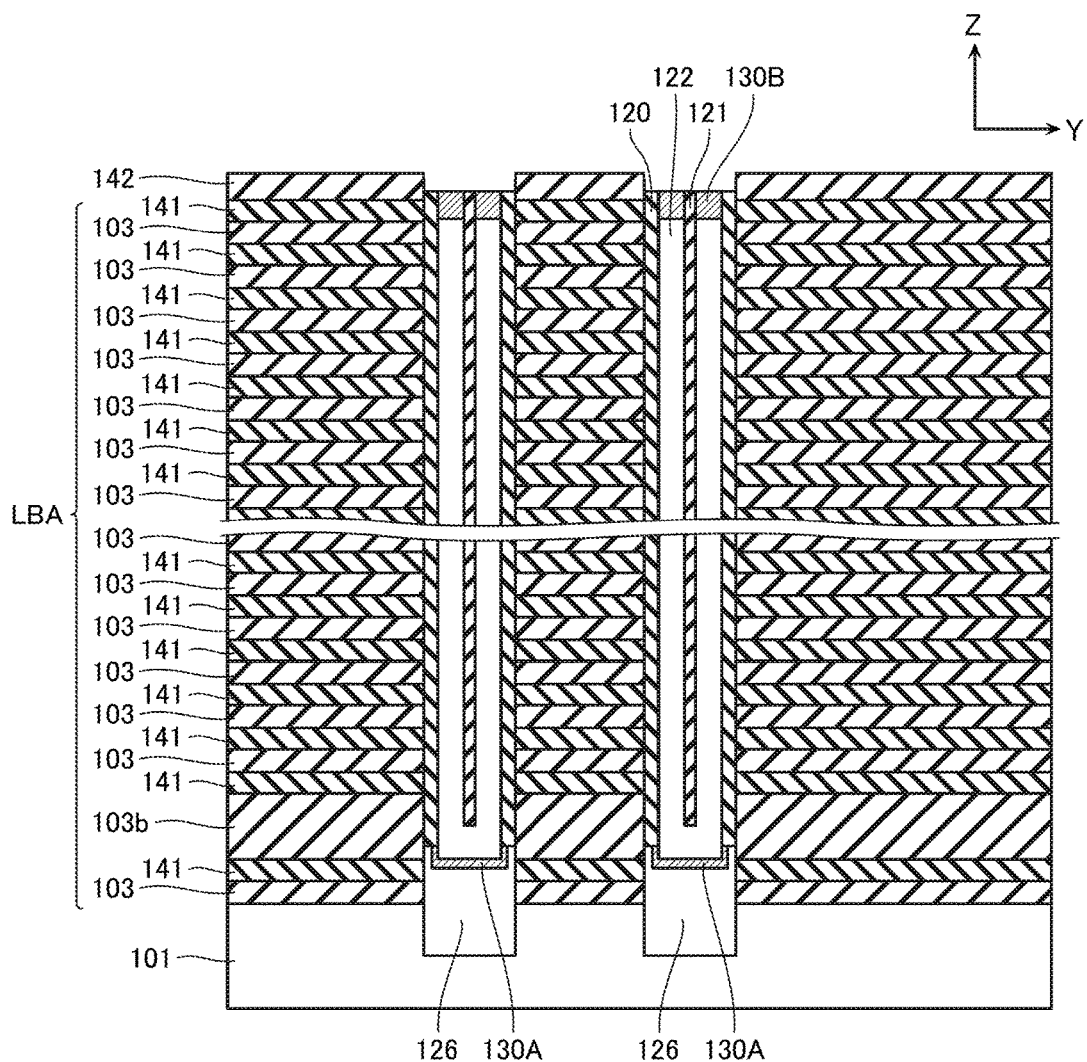
FIG. 20 is a cross-sectional view for describing the same method of manufacturing.

As shown in FIG. 20, the metal layer 131 unreacted in a step of FIG. 19 is removed similarly to removal of the metal layer 129 in FIG. 15.

Figure 21:
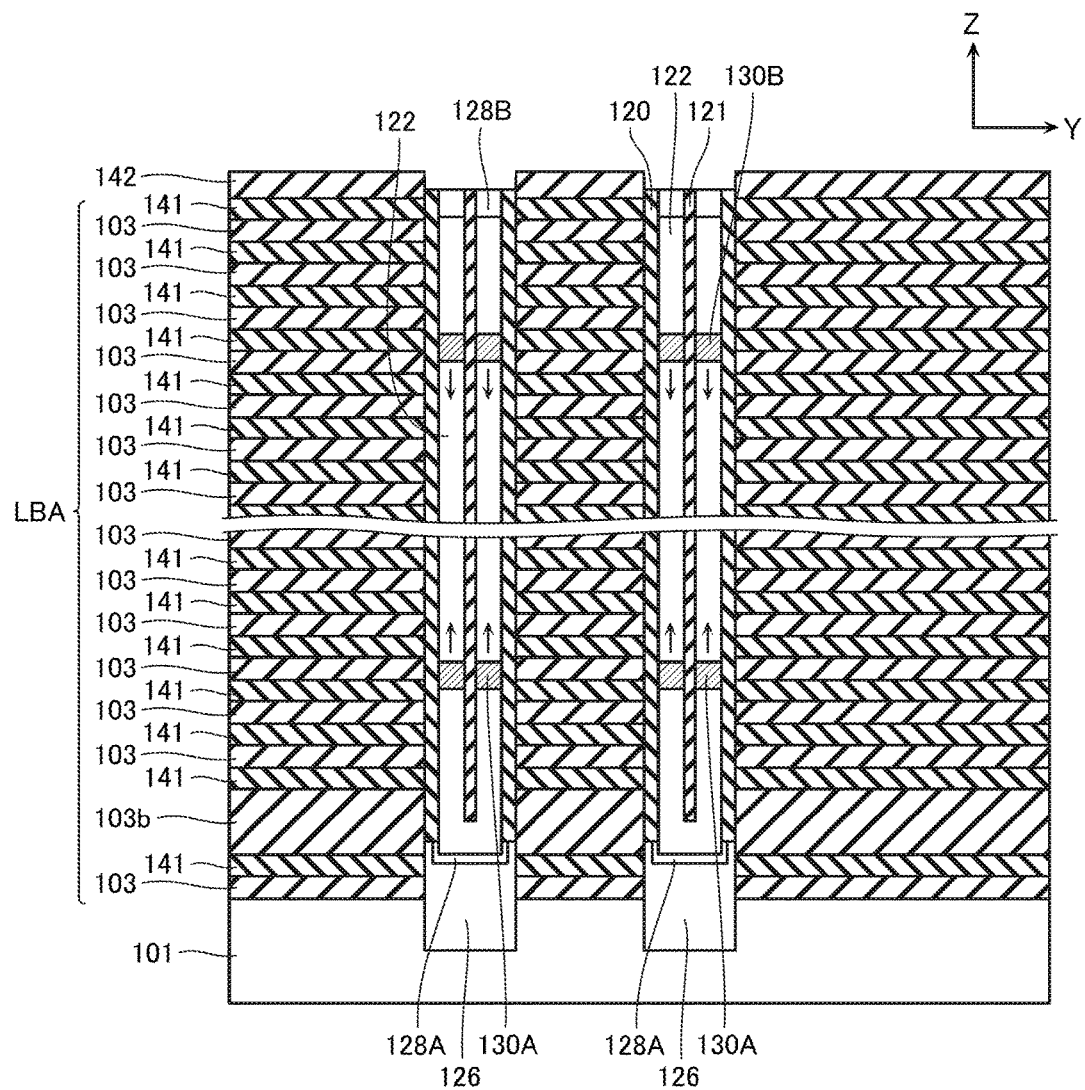
FIG. 21 is a cross-sectional view for describing the same method of manufacturing.

As shown in FIG. 21, an MILC (Metal Induced Lateral Crystallization) processing is performed. In the MILC processing, heat treatment is performed, whereby parts of the silicide layers 130A, 130B pass through the amorphous-state semiconductor layer 122'. That is, part of the silicide layer 130A on a substrate 101 side moves upwardly through the semiconductor layer 122'. Part of the silicide layer 130B on a semiconductor layer 122' upper end side moves toward the substrate 101 side, through the semiconductor layer 122'.

Now, the lattice constant and crystal structure of nickel disilicide are close to those of a single crystal of silicon (Si). Therefore, in portions passed through by the silicide layers 130A, 130B, of the semiconductor layer 122', the semiconductor layer 122 including comparatively large crystal grains, close to a single crystal structure, gets formed. Since the silicide layer 130A and the silicide layer 130B are of the same nickel disilicide, speeds at which each pass through the semiconductor layer 122' are substantially identical. Moreover, the silicide layer 130A and the silicide layer 130B are respectively formed in a substrate side end section (the lower end) and the upper end of the semiconductor layer 122'. Therefore, MILC reactions having the respective silicide layers as their growth ends bump into each other in the vicinity of the center with respect to the entire length in the Z direction of the semiconductor layer 122. These regions passed through by the respective silicide layers will be the first portion R1 and the second portion R2 described using FIGS. 6 and 7A. In this way, the boundary of the first portion R1 and the second portion R2 ends up being positioned in the central region including the vicinity of the center with respect to the entire length in the Z direction of the semiconductor layer 122. However, for example, due to the likes of conditions of the MILC reactions, speeds of progression of the silicide layer 130A and the silicide layer 130B sometimes differ, and, as a result, a position where the two bump into each other is sometimes misaligned from the central portion with respect to the entire length in the Z direction of the semiconductor layer 122. In this way, the central region in the present embodiment does not necessarily include the central portion with respect to the entire length in the Z direction of the semiconductor layer 122, and, in the case that MILC processing has been performed on the silicide layer 130A and the silicide layer 130B formed at the upper and lower ends of the semiconductor layer 122', is understood to mean a certain region including the position where the two bump into each other.

As described above, in the first portion R1 and the second portion R2, directions that the silicide layers 130A and 130B pass by an MILC method are opposite directions in relation to the Z direction. That is, in the portion through which the silicide layer 130A passes and the portion through which the silicide layer 130B passes, formation processes of the crystal grain will also be in opposite directions in relation to the Z direction. Therefore, as previously mentioned, plane orientations end up being different for the first portion R1 and the second portion R2. Note that a formation mechanism of the crystal structure is determined by various conditions, hence even when formation processes of the crystal grain are in opposite directions in relation to the Z direction, the plane orientations are not necessarily in opposite directions in relation to the Z direction.

Figure 22:
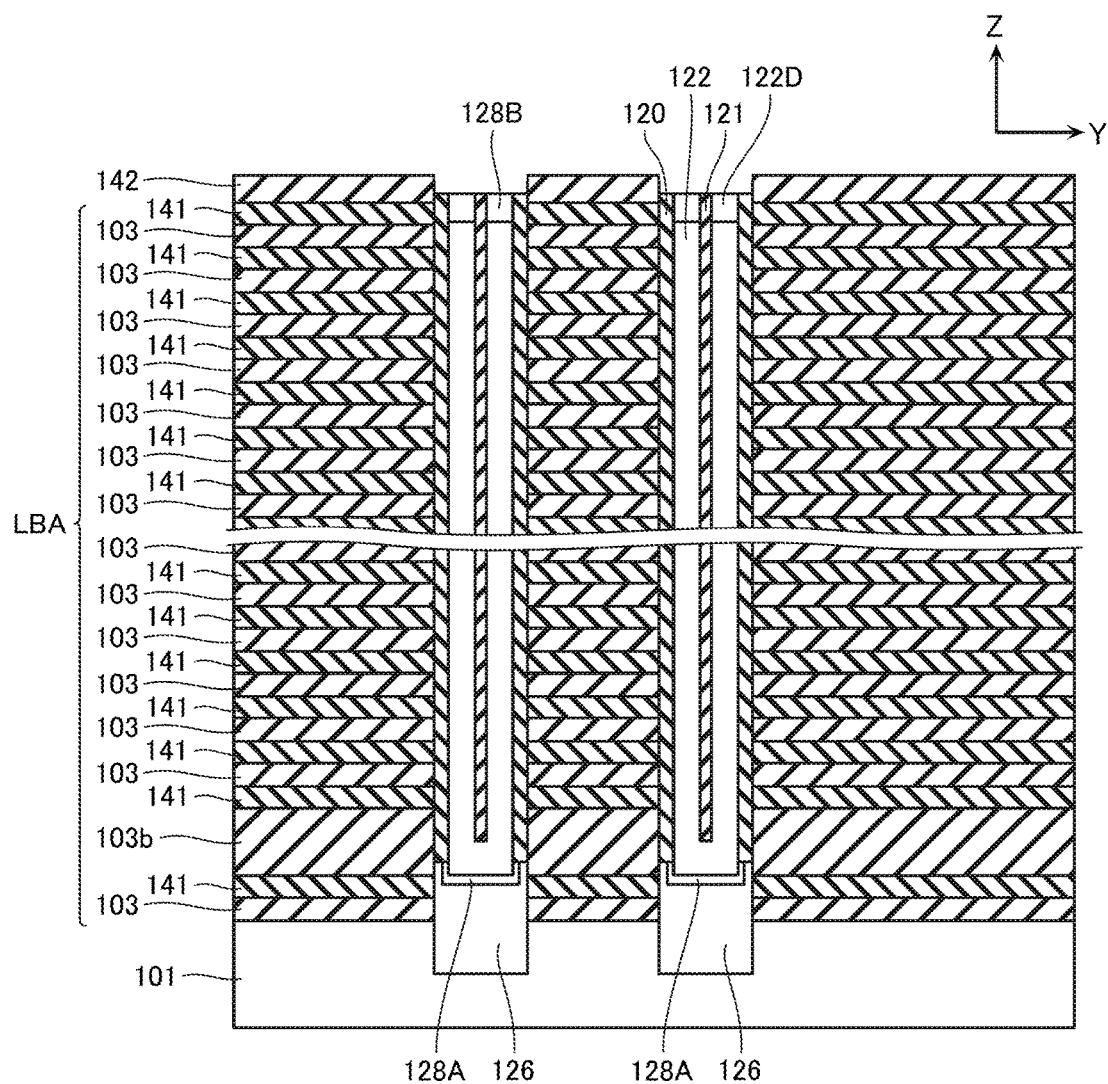
FIG. 22 is a cross-sectional view for describing the same method of manufacturing.

As shown in FIG. 22, when reaction due to the MILC method finishes, all of the nickel that had been included in the silicide layer 130A on a lower end side of the semiconductor layer 122 has been diffused in the semiconductor layer 122, and the silicide layer 130A is reformed into polysilicon that does not include a metal. This portion is the polysilicon layer 128A described using FIG. 7B. However, there are also cases where due to a time of heat treatment in the MILC method or an amount of nickel, the nickel is not all diffused, and in those cases, nickel sometimes exists between the lower end of the semiconductor layer 122 and the epitaxial layer 126 and/or between the first portion R1 and the second portion R2.

Figure 23:
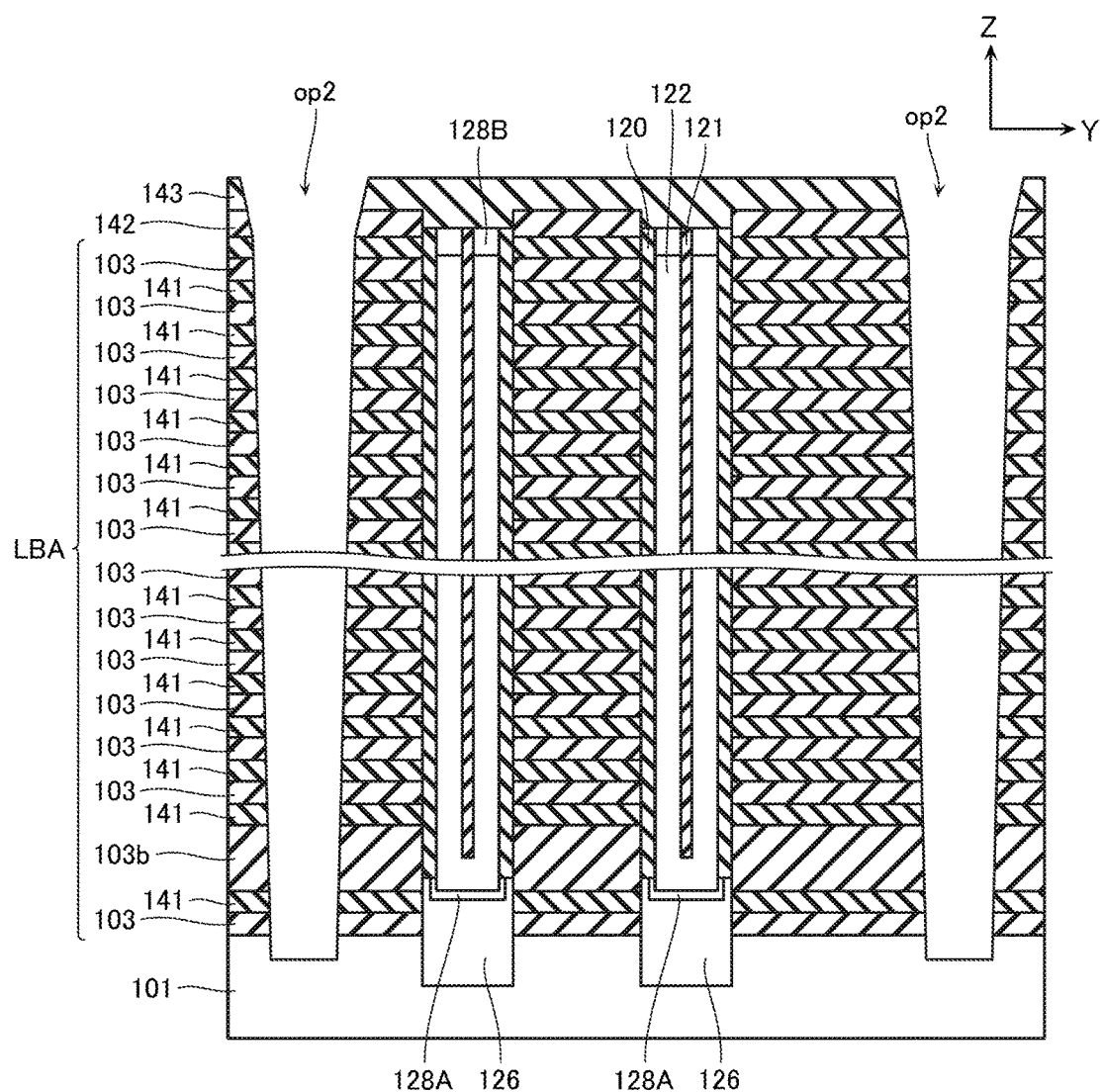
FIG. 23 is a cross-sectional view for describing the same method of manufacturing.

As shown in FIG. 23, an opening op2 is formed in the laminated body LBA. The opening op2 is a trench that extends in the Z direction and the X direction, penetrates the plurality of inter-layer insulating layers 103 and sacrifice layers 141 laminated on the substrate 101, and divides the laminated body LBA in the Y direction to expose the surface of the substrate 101. The opening op2 is formed by, for example, forming on the upper surface of the inter-layer insulating layer 142 the inter-layer insulating layer 143 having a trench in a portion corresponding to the opening op2, and performing RIE using this inter-layer insulating layer 143 as a mask.

Figure 24:
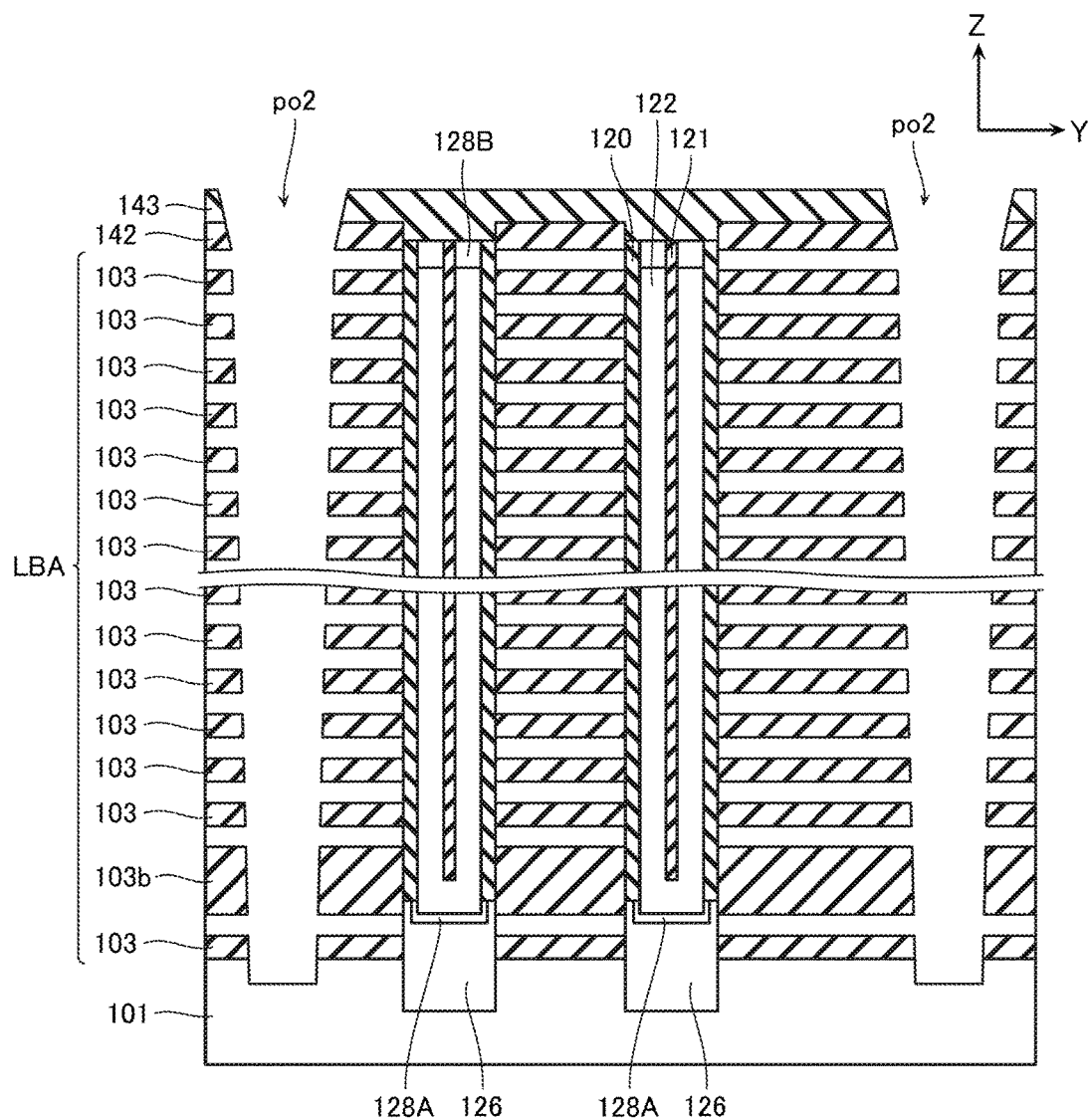
FIG. 24 is a cross-sectional view for describing the same method of manufacturing.

As shown in FIG. 24, the sacrifice layer 141 is removed via the opening op2. The sacrifice layer 141 is removed by the likes of wet etching using phosphoric acid, for example.

Then, steps such as formation of the conductive layer 102 and formation of the spacer insulating layer 112 and the conductive layer 108 are undergone, whereby the semiconductor memory device described with reference to FIGS. 5 to 7B is manufactured.

[Advantages]

Due to the present embodiment, the crystal structure of the semiconductor layer 122 functioning as the channel of the memory cell can be configured as a structure, close to a single crystal structure, in which crystal grains of large grain diameter congregate, hence even better cell characteristics can be achieved.

That is, by reforming the semiconductor layer 122' by the MILC method, a crystal grain boundary by which movement of electrons is hindered becomes smaller and mobility can be significantly improved, compared to in polysilicon.

Moreover, due to the present embodiment, processing by the MILC method is performed from both the lower end and the upper end of the semiconductor layer 122', hence it becomes possible for processing time to be shortened more outstandingly than in processing by a conventional MILC method.

Second Embodiment

A second embodiment will be described in detail with reference to FIGS. 25 to 42. Note that in the description below, configurations identical to those of the first embodiment will be assigned with identical symbols to those assigned in the first embodiment, and descriptions thereof will sometimes be omitted.

[Configuration]

Figure 25:
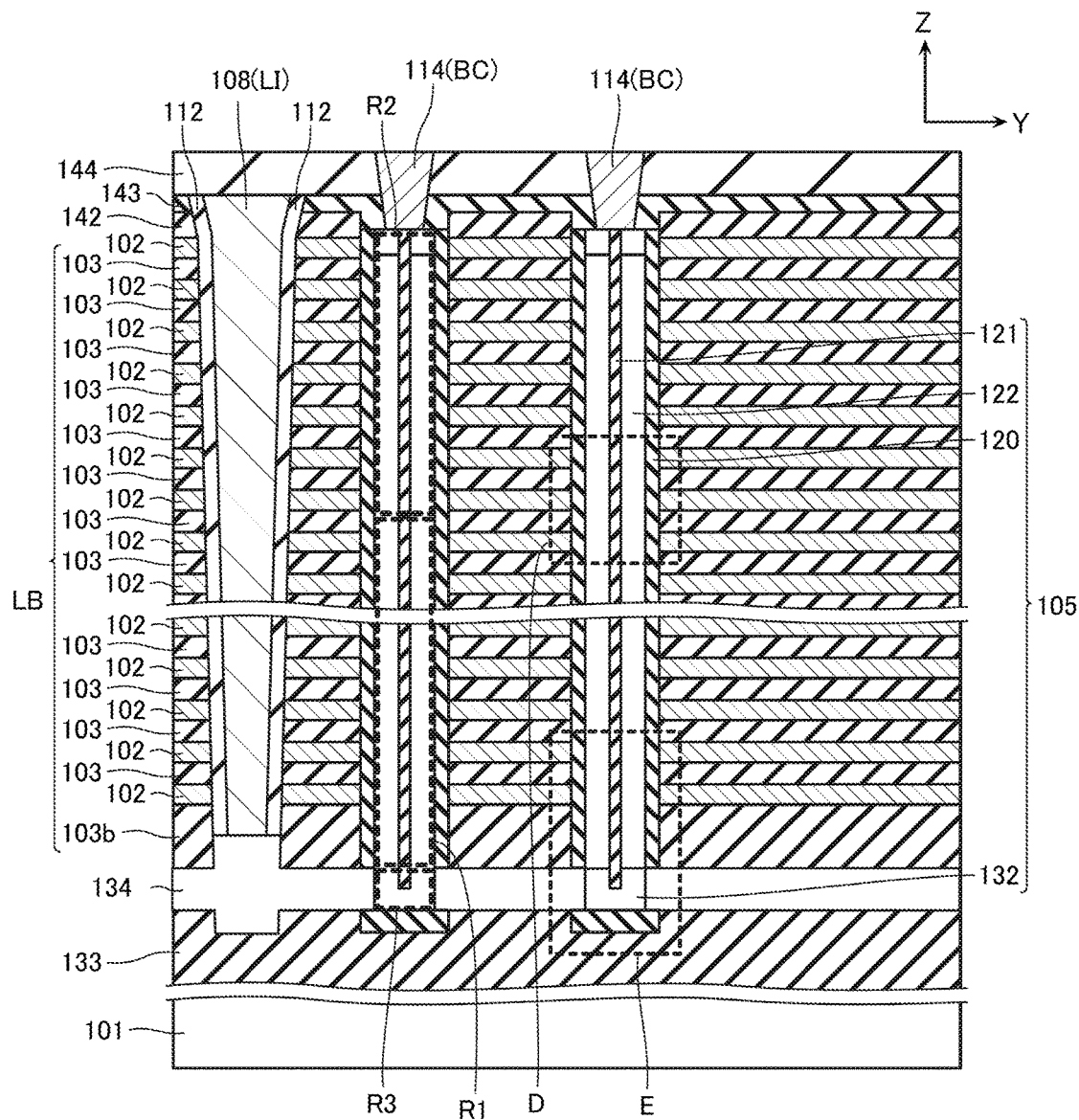
FIG. 25 is a cross-sectional view for describing a semiconductor memory device according to a second embodiment.
Figure 26A:
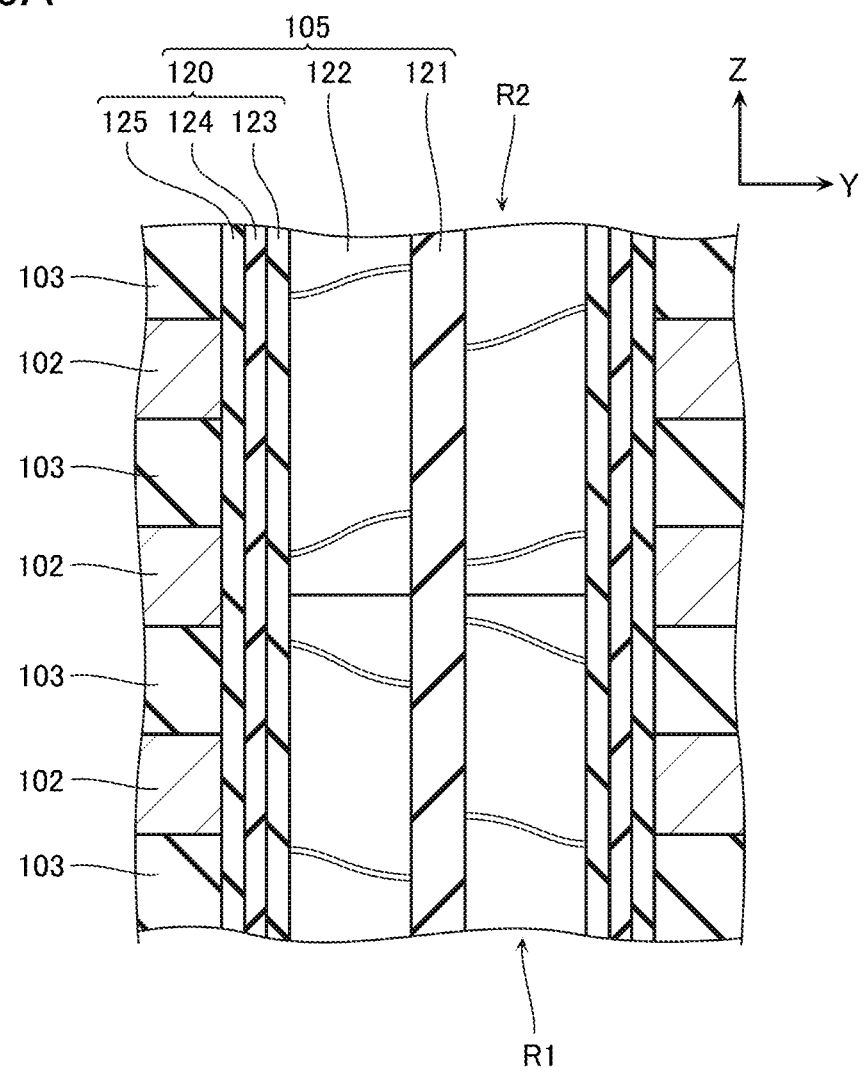
FIG. 26A is an enlarged view of a place indicated by D of FIG. 25.

A semiconductor memory device according to the second embodiment is similar to that of the first embodiment in the following kinds of points, namely the points that as shown in FIG. 25, a plurality of the conductive layers 102 are laminated above a substrate and the semiconductor layer 122 is provided so as to face the side surfaces of the conductive layers 102, and the point that as shown in FIG. 26A which is an enlarged view of a portion indicated by the symbol D of FIG. 25, the semiconductor layer 122 includes the first portion R1 and the second portion R2 that has a plane orientation which is different from the plane orientation of the first portion R1.

Figure 26B:
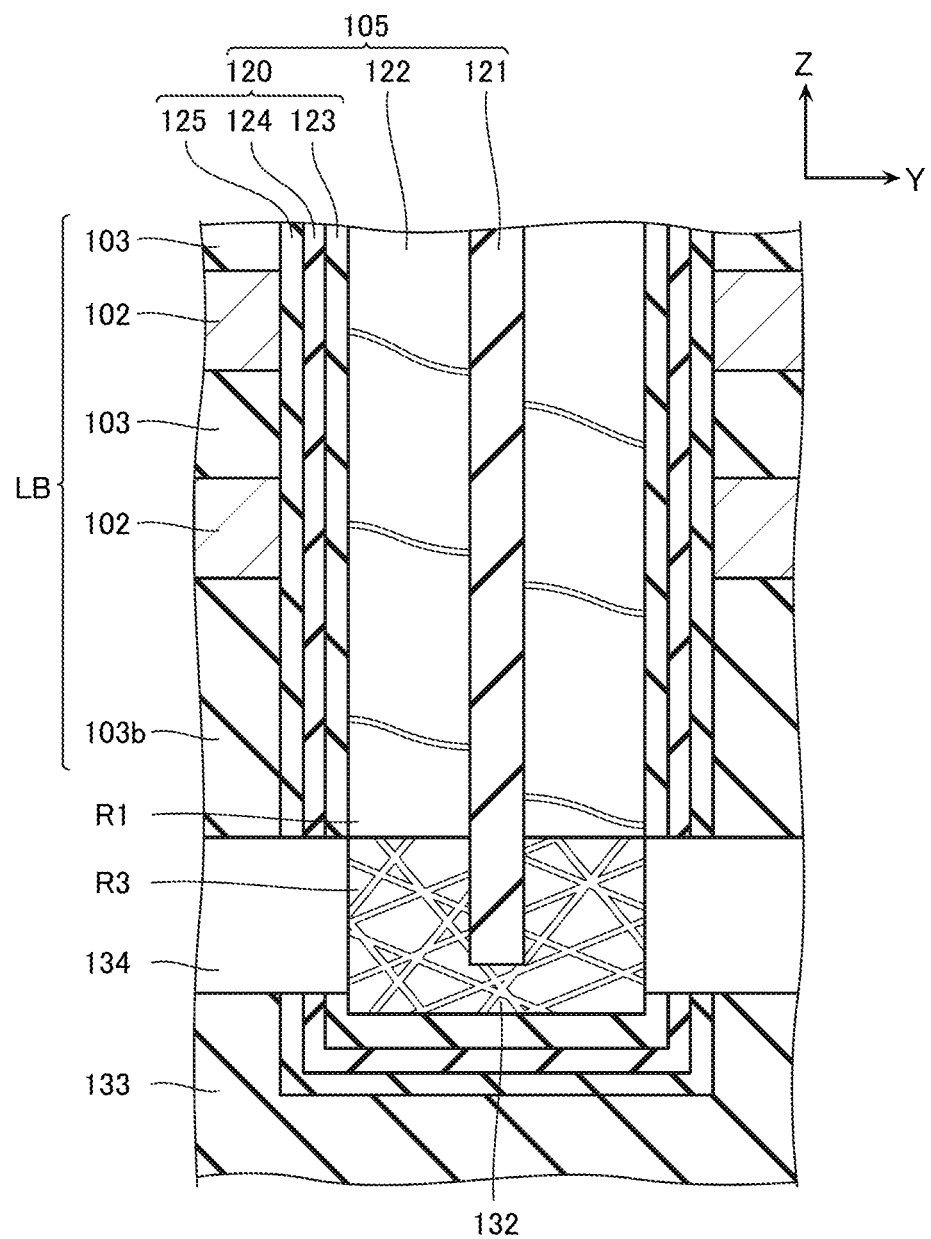
FIG. 26B is an enlarged view of a place indicated by E of FIG. 25.

In the second embodiment, as shown in FIG. 25 and FIG. 26B which is an enlarged view of a portion indicated by the symbol E of FIG. 25, a structure between the substrate 101 and the lower end of the semiconductor layer 122 and a configuration of a periphery of the lower end of the semiconductor layer 122 are different from those of the first embodiment.

As shown in FIG. 25, in the present embodiment, a semiconductor layer 134 (first wiring line) is provided between the substrate 101 and the plurality of conductive layers 102, and the lower end of the semiconductor layer 122 is connected to the conductive layer 108 via this semiconductor layer 134. Moreover, an inter-layer insulating layer 133 is provided between the semiconductor layer 134 and the substrate 101. An unshown cell wiring line is provided between this inter-layer insulating layer 133 and the substrate 101.

As shown in FIG. 26B, in the present embodiment, the semiconductor layer 122 includes a third portion R3 in addition to the first portion R1 and the second portion R2. The third portion R3 extends downwardly in the Z direction from the lower end of the first portion R1. That is, the third portion R3 is provided between the first portion R1 and the substrate 101. Note that the third portion R3 is of a substantially cylindrical shape. The third portion R3 includes polysilicon. Therefore, crystal grains included in the third portion R3 are smaller than crystal grains included in the other part of the semiconductor layer 122.

The semiconductor layer 134 is connected from the X direction and the Y direction, to a side surface of the third portion R3 of the semiconductor layer 122. The semiconductor layer 134 is configured from doped polysilicon, for example. The semiconductor layer 134 connects between the conductive layer 108 functioning as the source line contact LI and the semiconductor layer 122 functioning as the channel body.

Even in the present embodiment, similarly to in the first embodiment, the crystal structure of the semiconductor layer 122 functioning as the channel of the memory cell can be configured as a structure, close to a single crystal structure, in which crystal grains of large grain diameter congregate, hence even better cell characteristics can be achieved.

[Method of Manufacturing]

A method of manufacturing the semiconductor memory device according to the second embodiment will be described using FIGS. 27 to 42.

Figure 27:
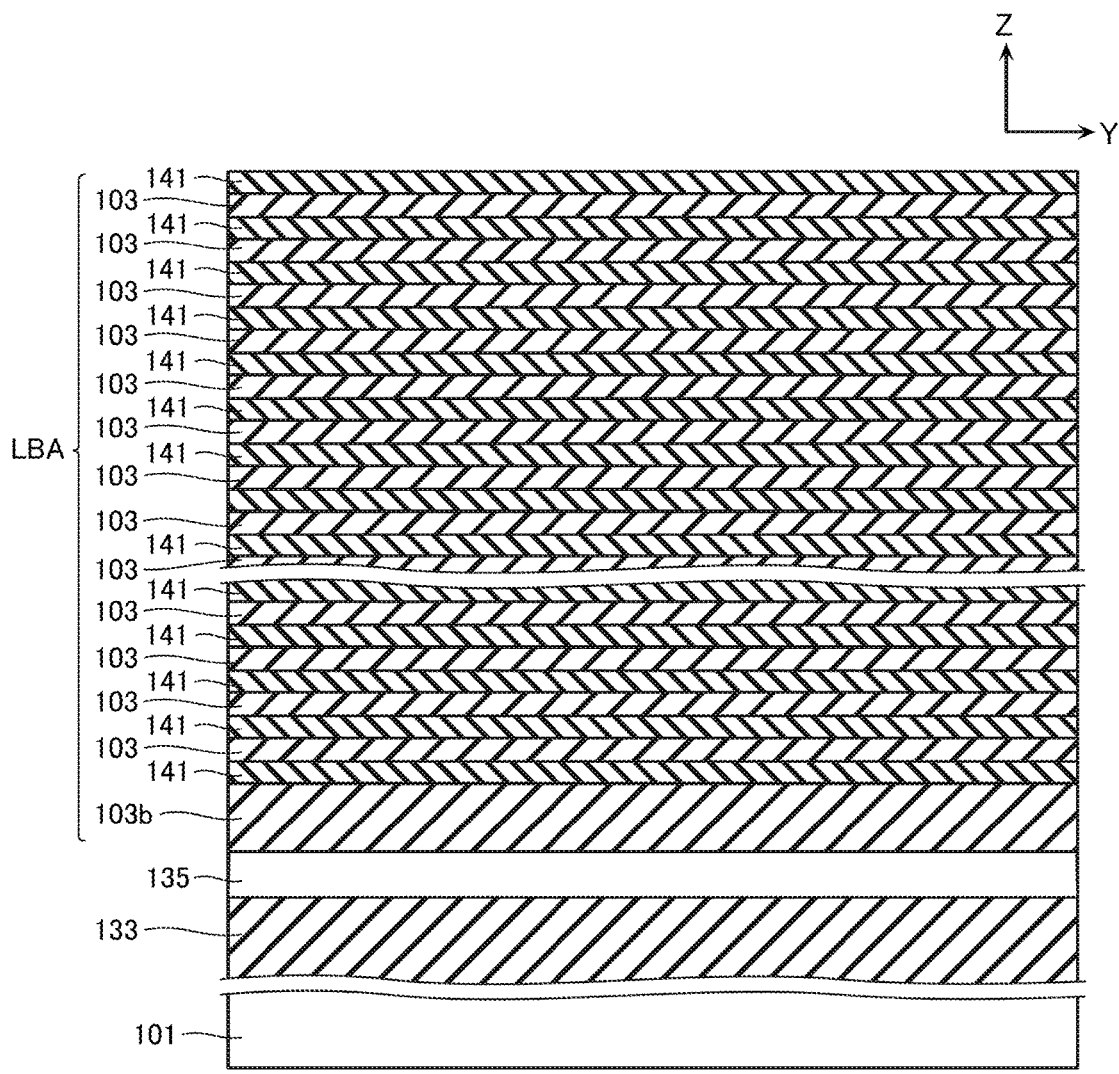
FIG. 27 is a cross-sectional view for describing a method of manufacturing the semiconductor memory device according to the second embodiment.

As shown in FIG. 27, in the method of manufacturing according to the present embodiment, the inter-layer insulating layer 133 and a semiconductor layer 135 are deposited, after creation of the unshown cell wiring line, on the substrate 101. The semiconductor layer 135 is configured from silicon, for example. A plurality of the inter-layer insulating layers 103 (including the inter-layer insulating layer 103b) and sacrifice layers 141 are laminated alternately on an upper surface of the semiconductor layer 135 to form the laminated body LBA. The sacrifice layer 141 is configured from the likes of silicon nitride ($Si_3N_4$), for example. Deposition of the inter-layer insulating layer 103 and the sacrifice layer 141 is performed by a method such as CVD, for example.

Figure 28:
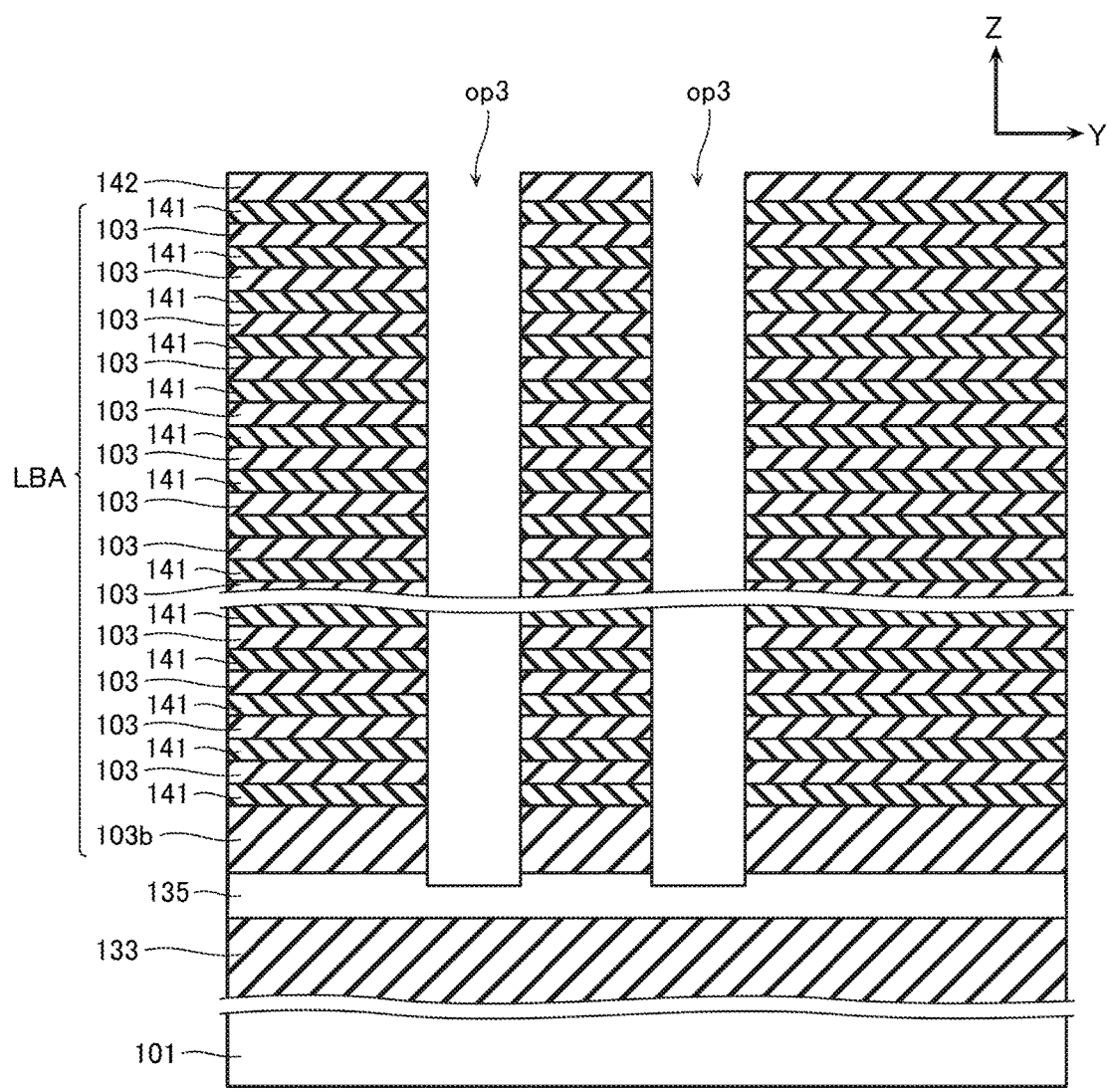
FIG. 28 is a cross-sectional view for describing the same method of manufacturing.

As shown in FIG. 28, an opening op3' is formed in the laminated body LBA. The opening op3' is formed by, for example, RIE using the semiconductor layer 135 as an etching stopper. In the illustrated example, a lower end of the opening op3' is positioned in a vicinity of an upper surface of the semiconductor layer 135.

Figure 29:
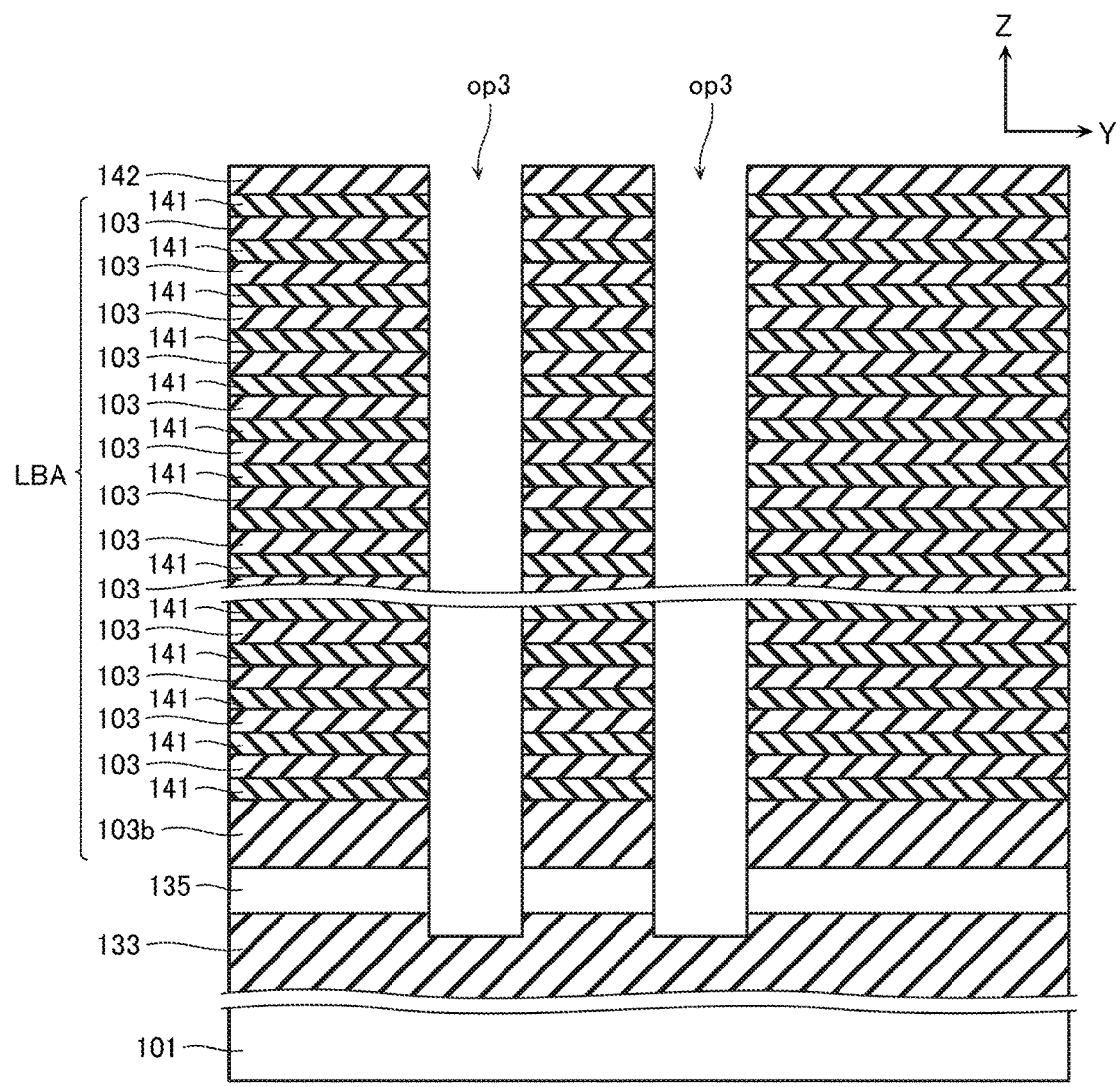
FIG. 29 is a cross-sectional view for describing the same method of manufacturing.

As shown in FIG. 29, part of the semiconductor layer 135 is removed to form an opening op3. The opening op3 is a through hole that extends in the Z direction and penetrates the laminated body LBA and the semiconductor layer 135 to expose an upper surface of the inter-layer insulating layer 133. This opening op3 is formed by removing the semiconductor layer 135 by a chemical such as TMY (choline), for example.

Figure 30:
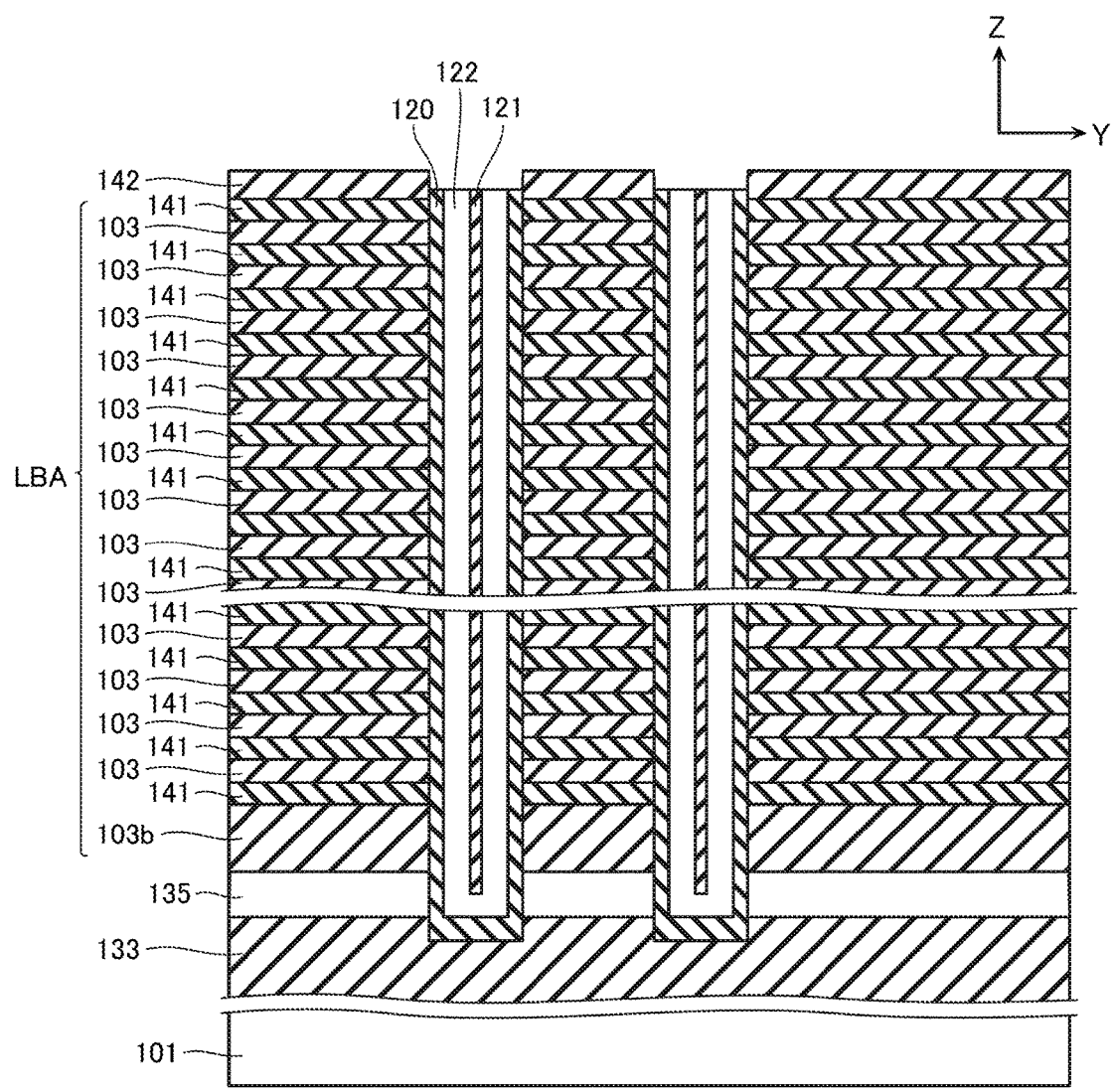
FIG. 30 is a cross-sectional view for describing the same method of manufacturing.

As shown in FIG. 30, the gate insulating layer 120, a semiconductor layer 122', and the core insulating layer 121 are deposited sequentially on an inside of the opening op3. Now, in the present embodiment, as is understood from FIGS. 29 and 30, the gate insulating layer 120, the semiconductor layer 122', and the core insulating layer 121 are deposited by a succession of steps after formation of the opening op3. That is, a step removing a bottom section of the gate insulating layer 120 is not performed after deposition of the gate insulating layer 120. This is because, as shown in FIG. 25, connection of the semiconductor layer 122 and the source line contact LI is performed by the semiconductor layer 134 provided on the side surface of the lower end of the semiconductor layer 122. Therefore, there is no need to largely secure an opening of the opening op3 for RIE to remove the bottom section of the gate insulating layer 120. It is hence made possible for a diameter of the memory columnar body 105 to be made smaller and for the device to be more miniaturized.

Figure 31:
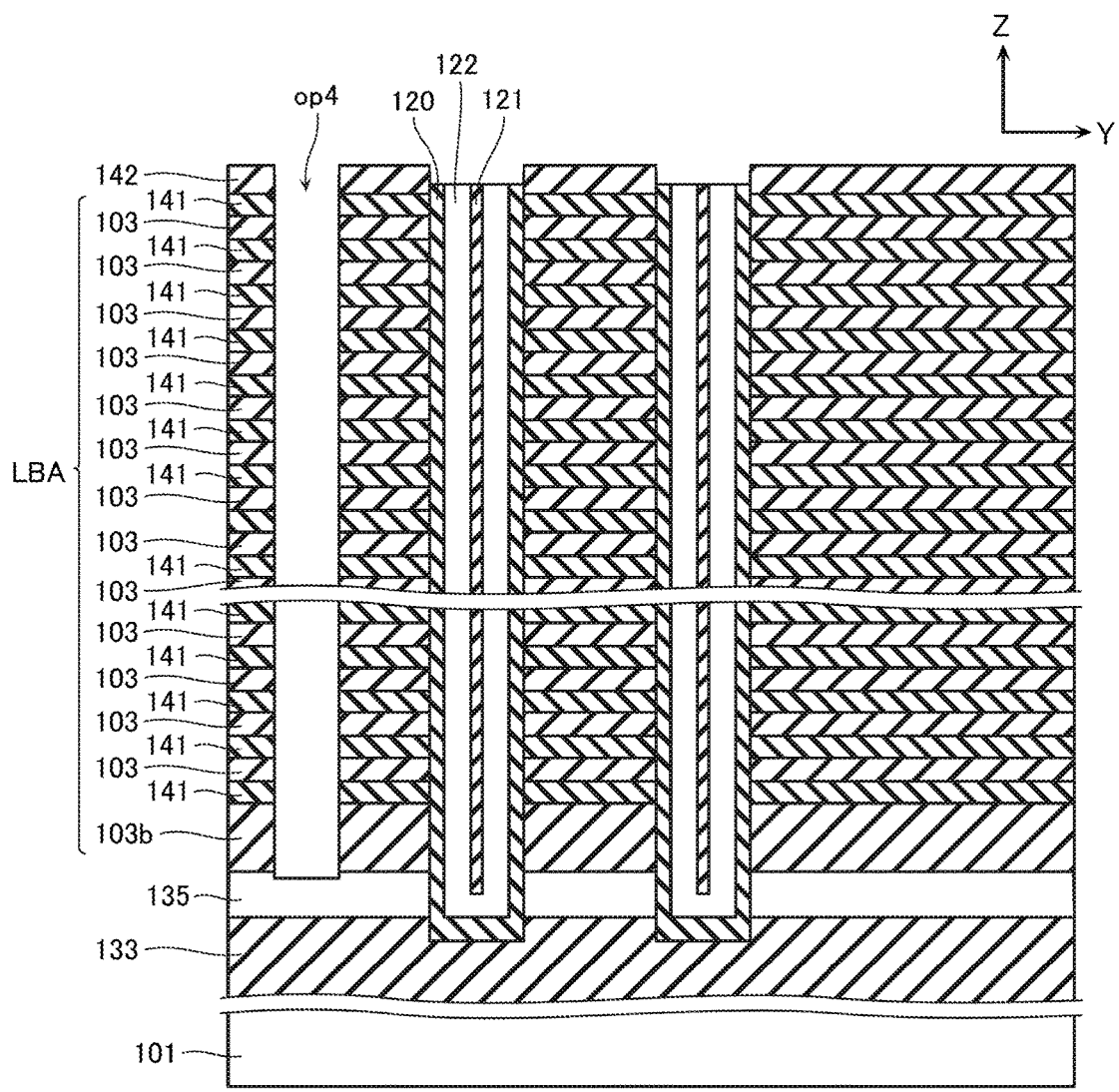
FIG. 31 is a cross-sectional view for describing the same method of manufacturing.

As shown in FIG. 31, an opening op4' is formed similarly to in a step shown in FIG. 28.

Figure 32:
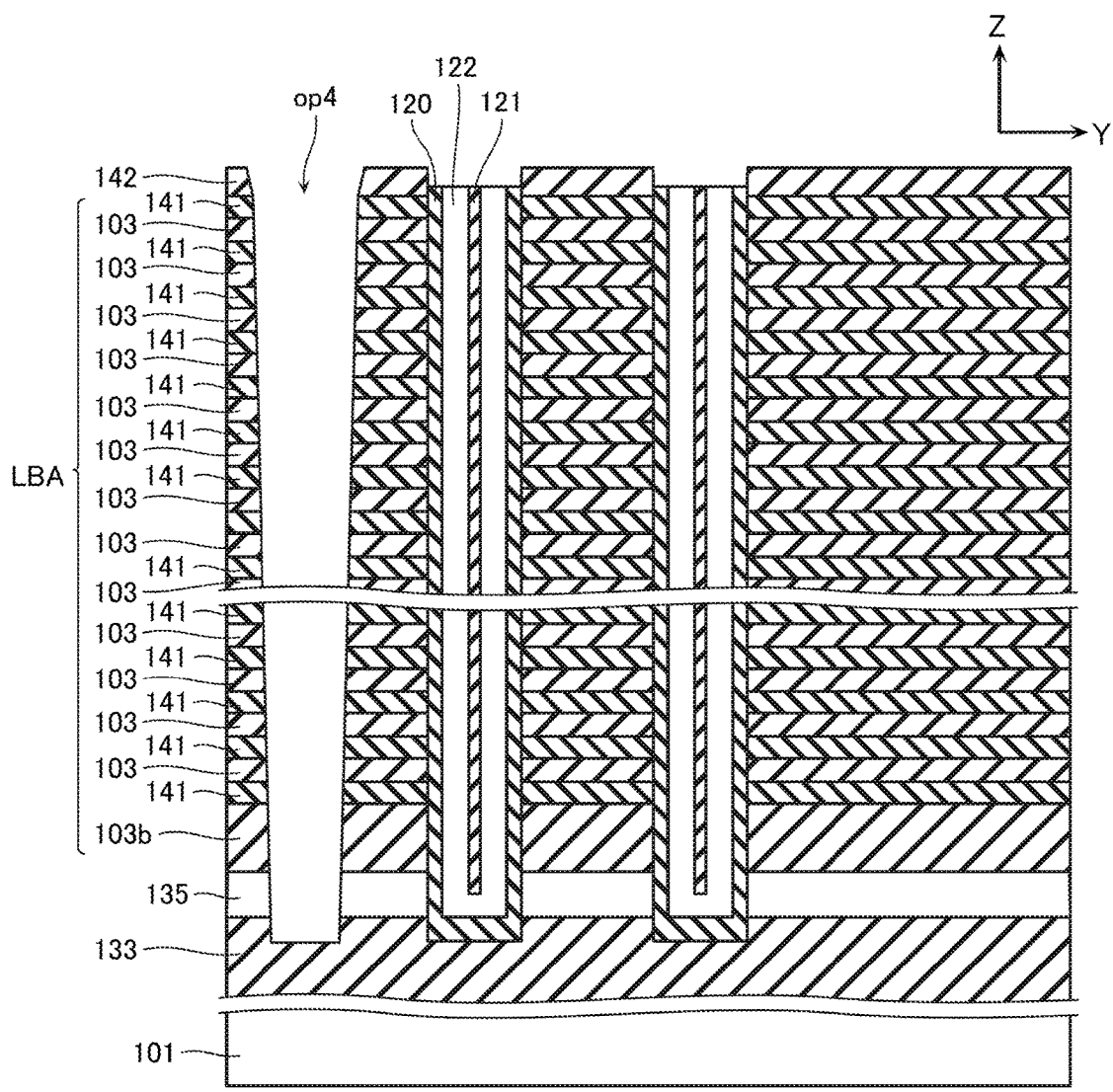
FIG. 32 is a cross-sectional view for describing the same method of manufacturing.

As shown in FIG. 32, an opening op4 is formed similarly to in a step shown in FIG. 29. The opening op4 is a trench that extends in the Z direction and the X direction, penetrates the plurality of inter-layer insulating layers 103 and sacrifice layers 141 laminated on the substrate 101, and divides the laminated body LBA in the Y direction to expose the upper surface of the inter-layer insulating layer 133.

Figure 33:
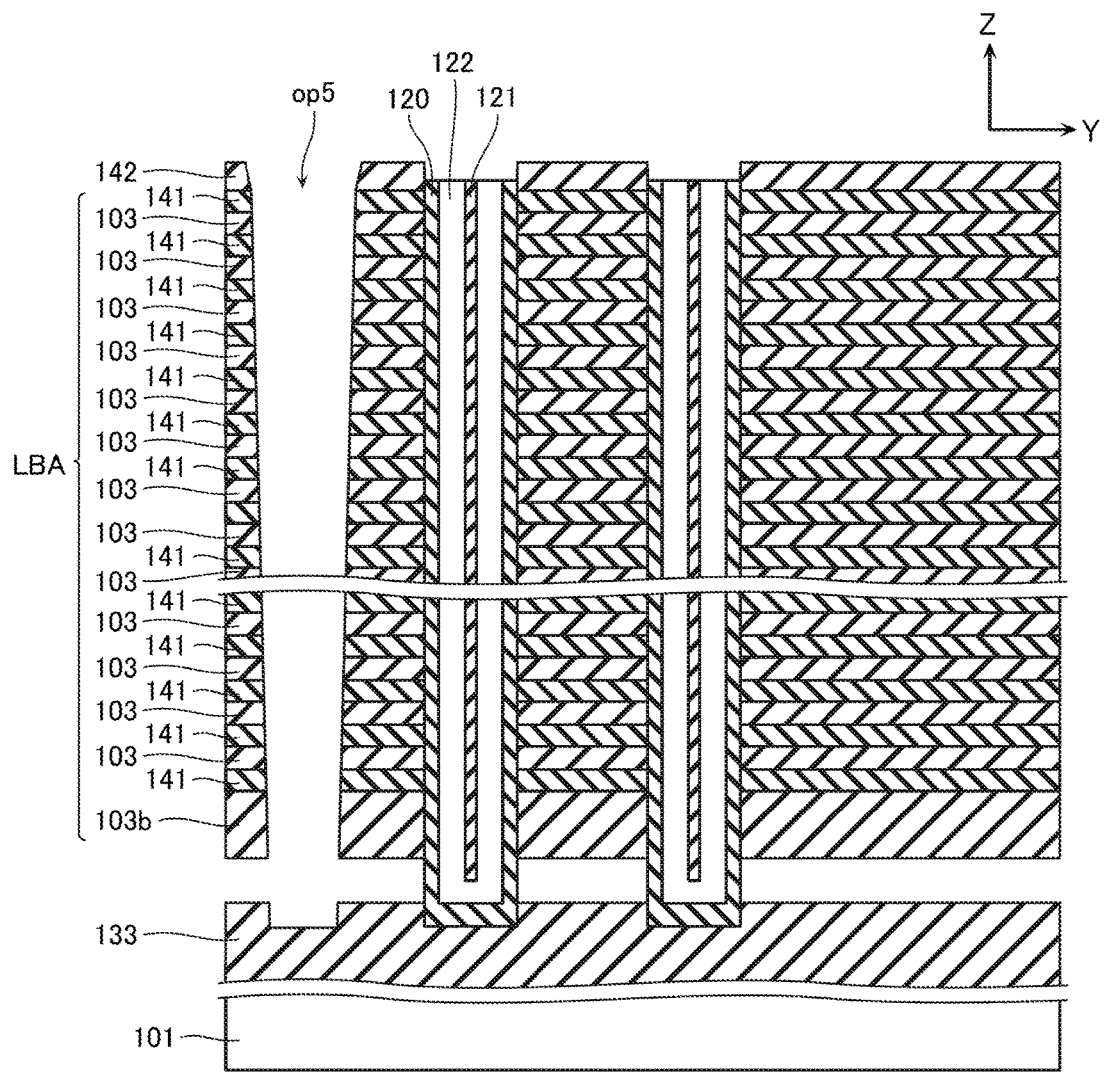
FIG. 33 is a cross-sectional view for describing the same method of manufacturing.

As shown in FIG. 33, the semiconductor layer 135 is removed to form an opening op5. The opening op5 is an opening that exposes a lower end side surface of the gate insulating layer 120, via a region where the opening op4 and the semiconductor layer 135 have been formed. Removal of the semiconductor layer 135 is performed by wet etching using a chemical such as THY (choline), for example.

Figure 34:
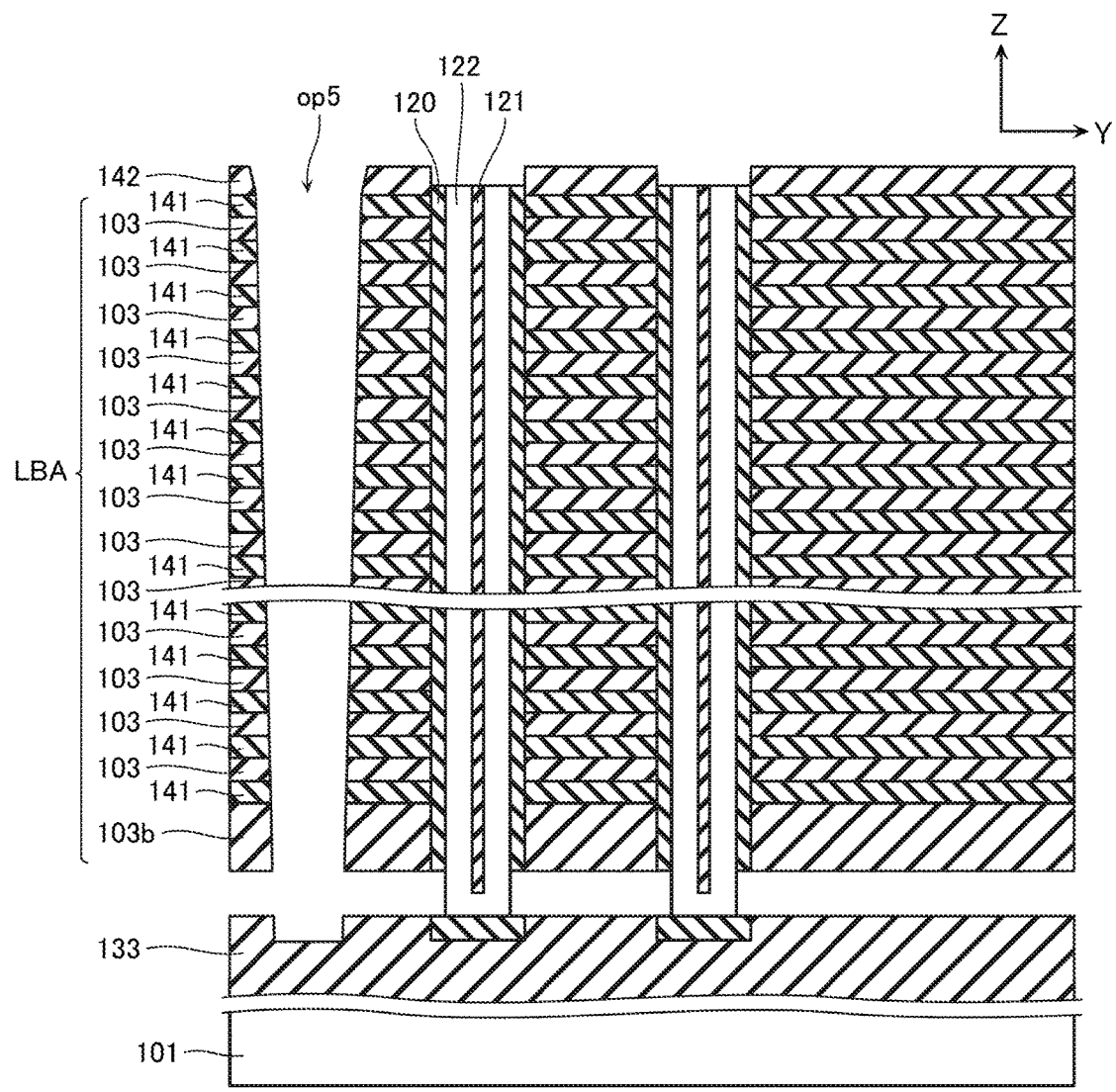
FIG. 34 is a cross-sectional view for describing the same method of manufacturing.

As shown in FIG. 34, part (a portion exposed in the opening op5 caused by removal of the semiconductor layer 135) of the gate insulating layer 120 is removed using a chemical such as DHF (dilute hydrofluoric acid), for example.

Figure 35:
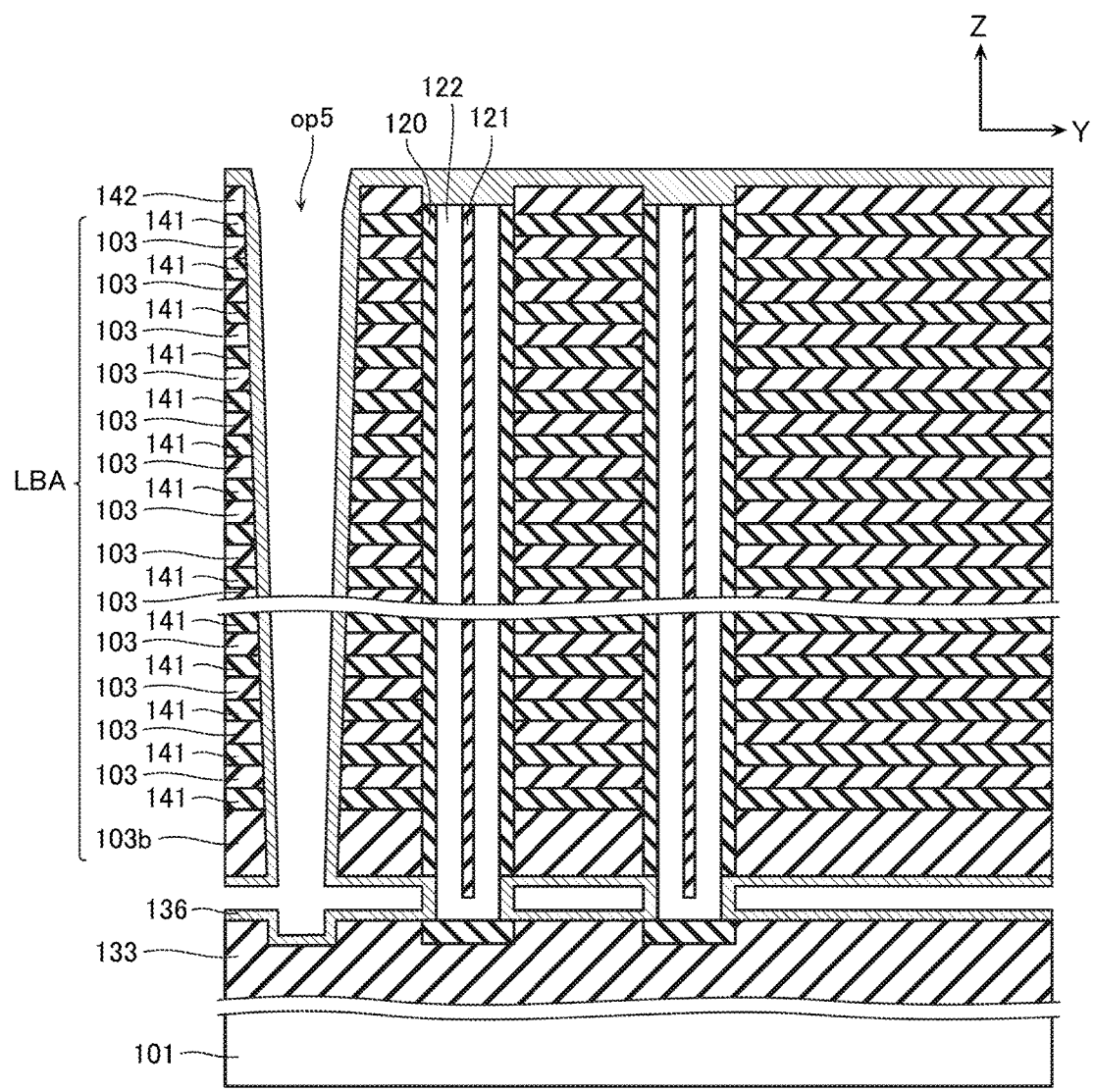
FIG. 35 is a cross-sectional view for describing the same method of manufacturing.

As shown in FIG. 35, a metal layer 136 is deposited on an inside of the opening op5. The metal layer 136 is formed by a metal such as nickel, for example, being deposited using CVD or PVD such as sputtering, similarly to in a step shown in FIG. 13.

Figure 36:
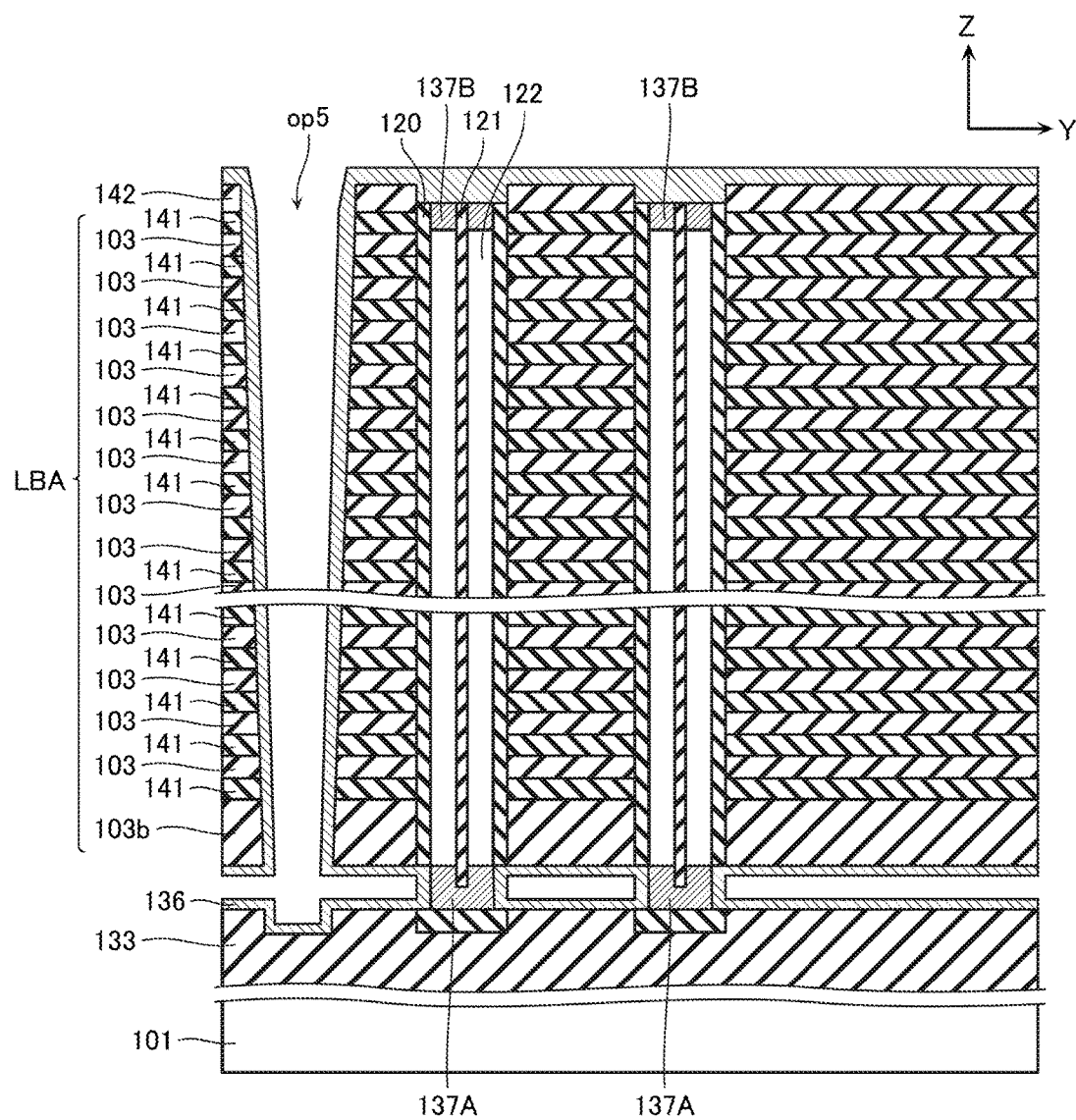
FIG. 36 is a cross-sectional view for describing the same method of manufacturing.

As shown in FIG. 36, heat treatment is applied to form a silicide layer 137A and a silicide layer 137B. Now, the silicide layer 137A of a portion contacting the lower end of the semiconductor layer 122' undergoes a similar step to that shown in FIG. 14 in the first embodiment. In the present embodiment, furthermore, the metal layer 136 contacts also an upper surface of the semiconductor layer 122', hence the silicide layer 137B is also simultaneously formed. In this case also, all that is silicided is a portion where the metal layer 136 and the semiconductor layer 122' contact, and the metal layer 136 in a portion not contacting the semiconductor layer 122' remains unchanged as a metal.

Figure 37:
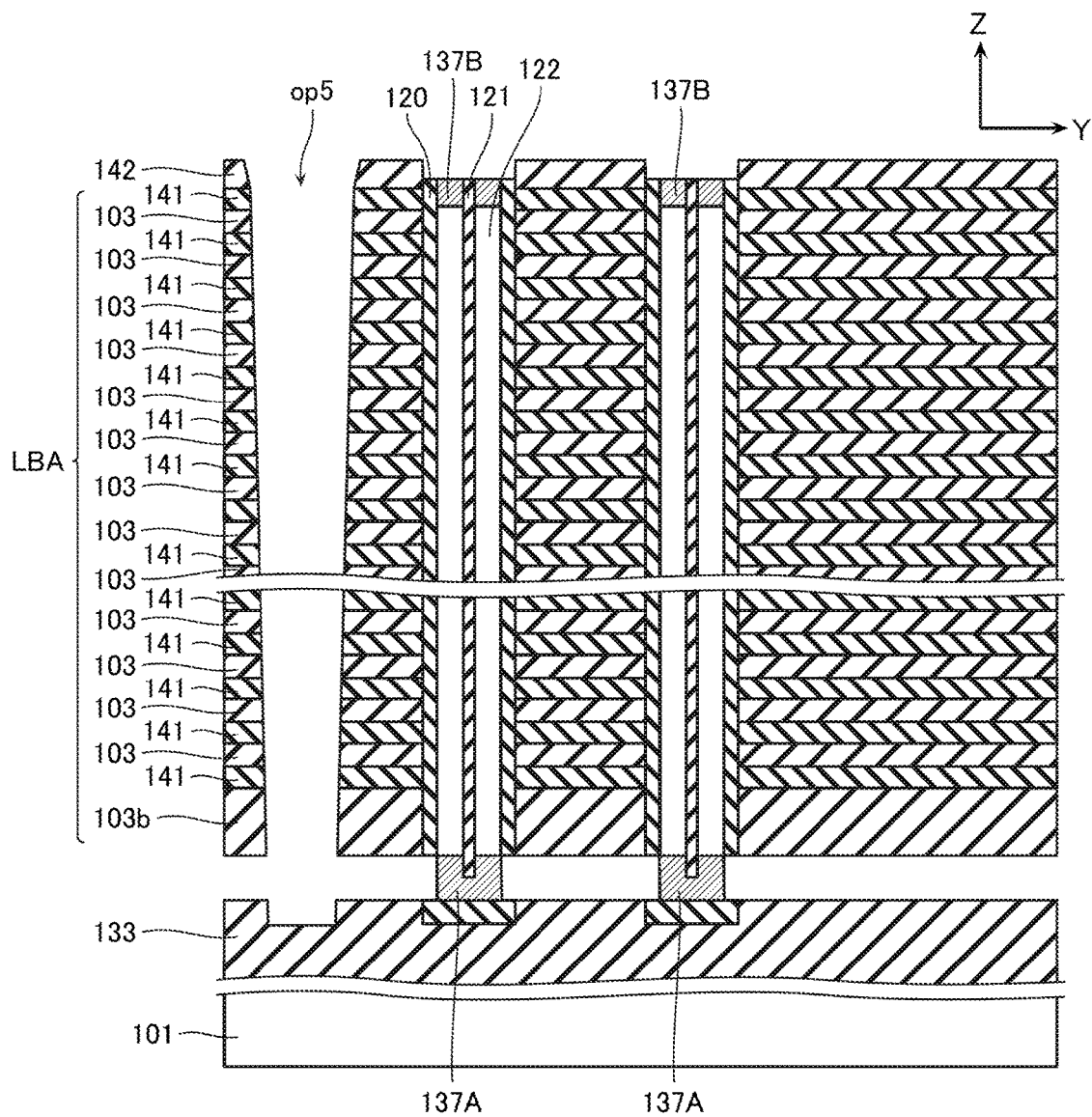
FIG. 37 is a cross-sectional view for describing the same method of manufacturing.

As shown in FIG. 37, the metal layer 136 that has not undergone siliciding in a step of FIG. 36 is removed, similarly to in a step shown in FIG. 15 of the first embodiment.

Figure 38:
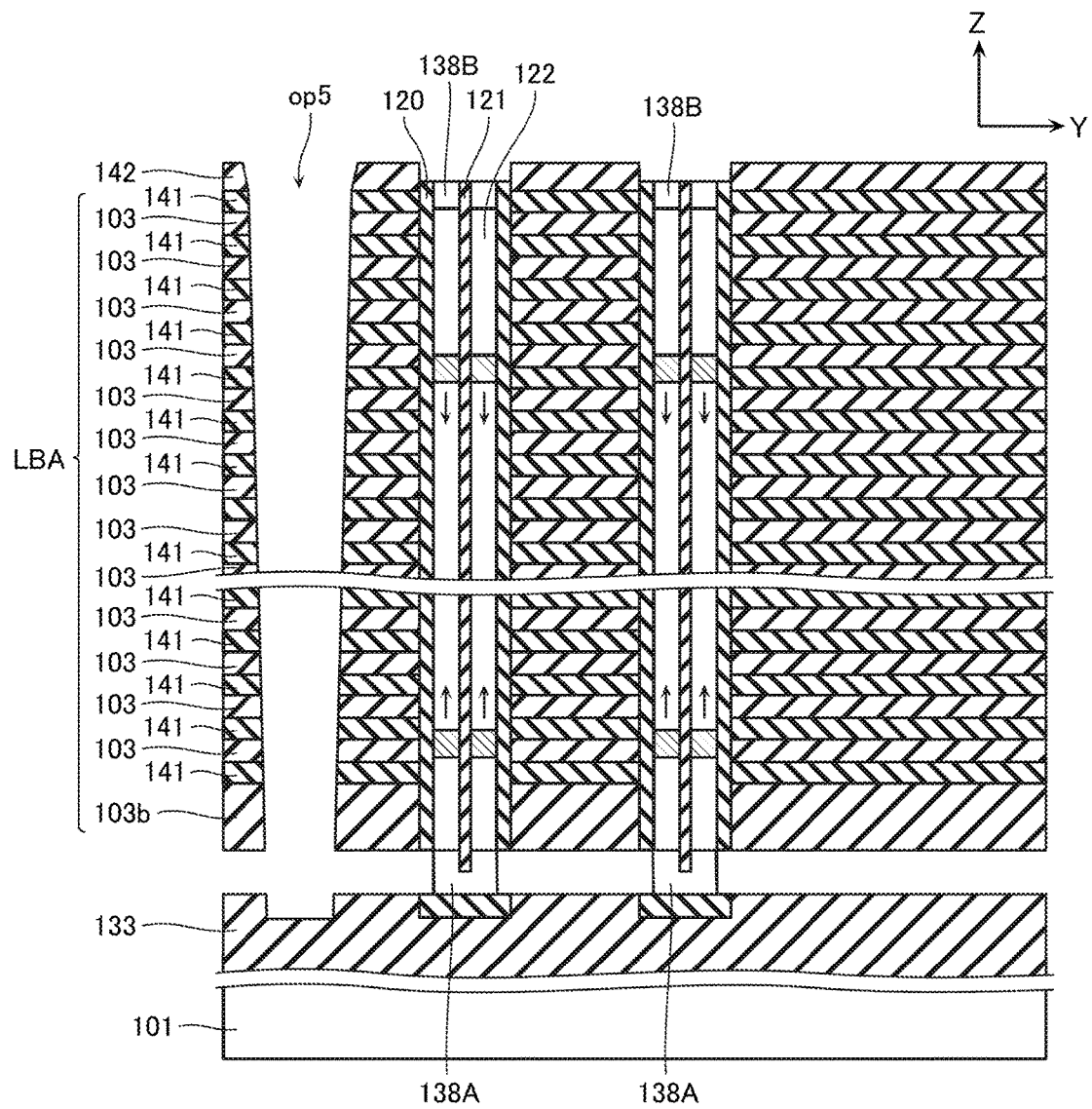
FIG. 38 is a cross-sectional view for describing the same method of manufacturing.

As shown in FIG. 38, MILC processing is performed and the amorphous-state semiconductor layer 122' is reformed, whereby the semiconductor layer 122 having a comparatively large crystal grain is formed, similarly to in a step shown in FIG. 21 of the first embodiment.

Figure 39:
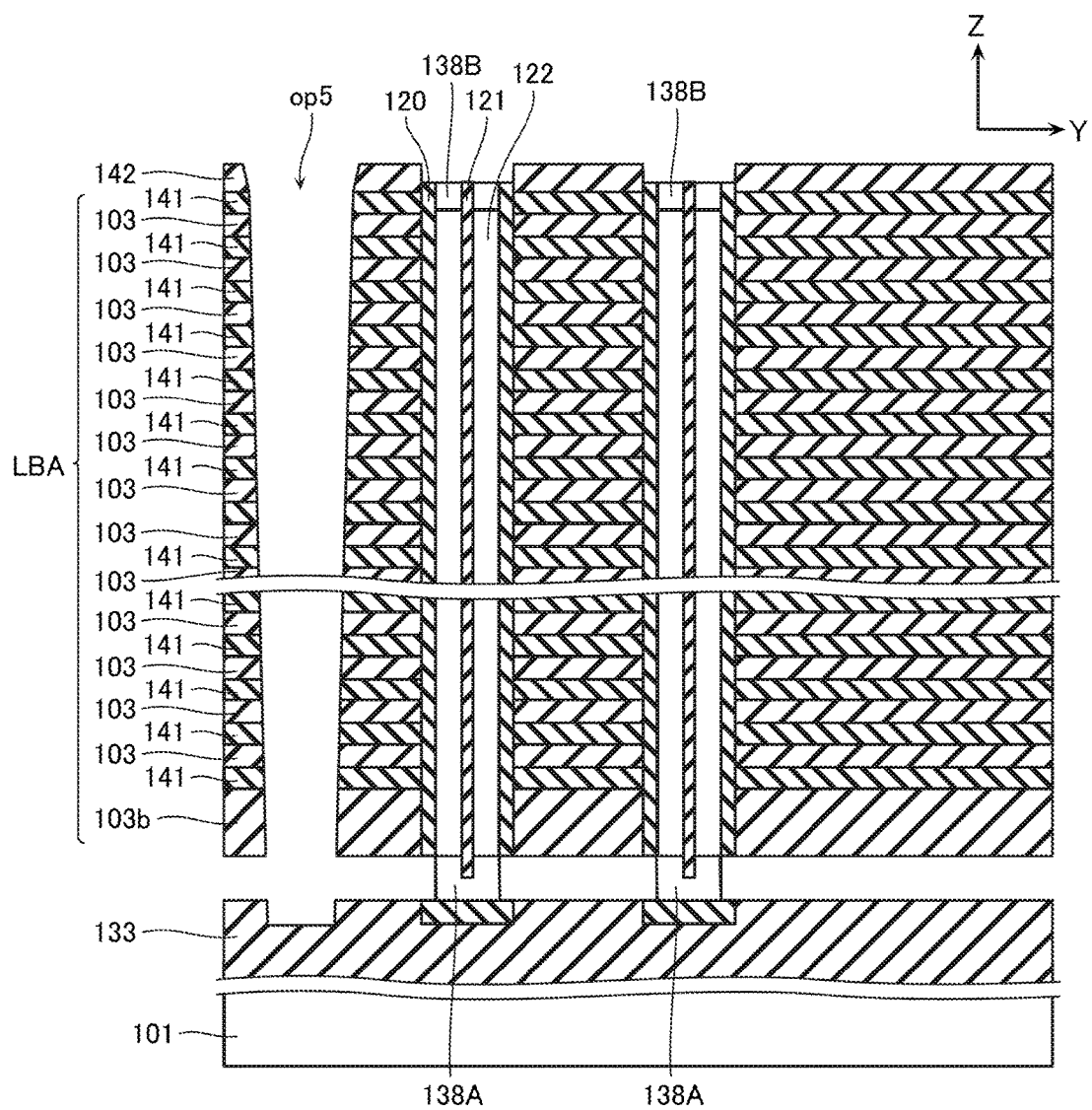
FIG. 39 is a cross-sectional view for describing the same method of manufacturing.

As shown in FIG. 39, when the MILC processing finishes, the nickel that had been included in the silicide layers 137A and 137B is diffused in the semiconductor layer 122, and the silicide layers 137A and 137B are reformed into polysilicon layers 138A and 138B that do not include a metal, similarly to a state shown in FIG. 22.

Figure 40:
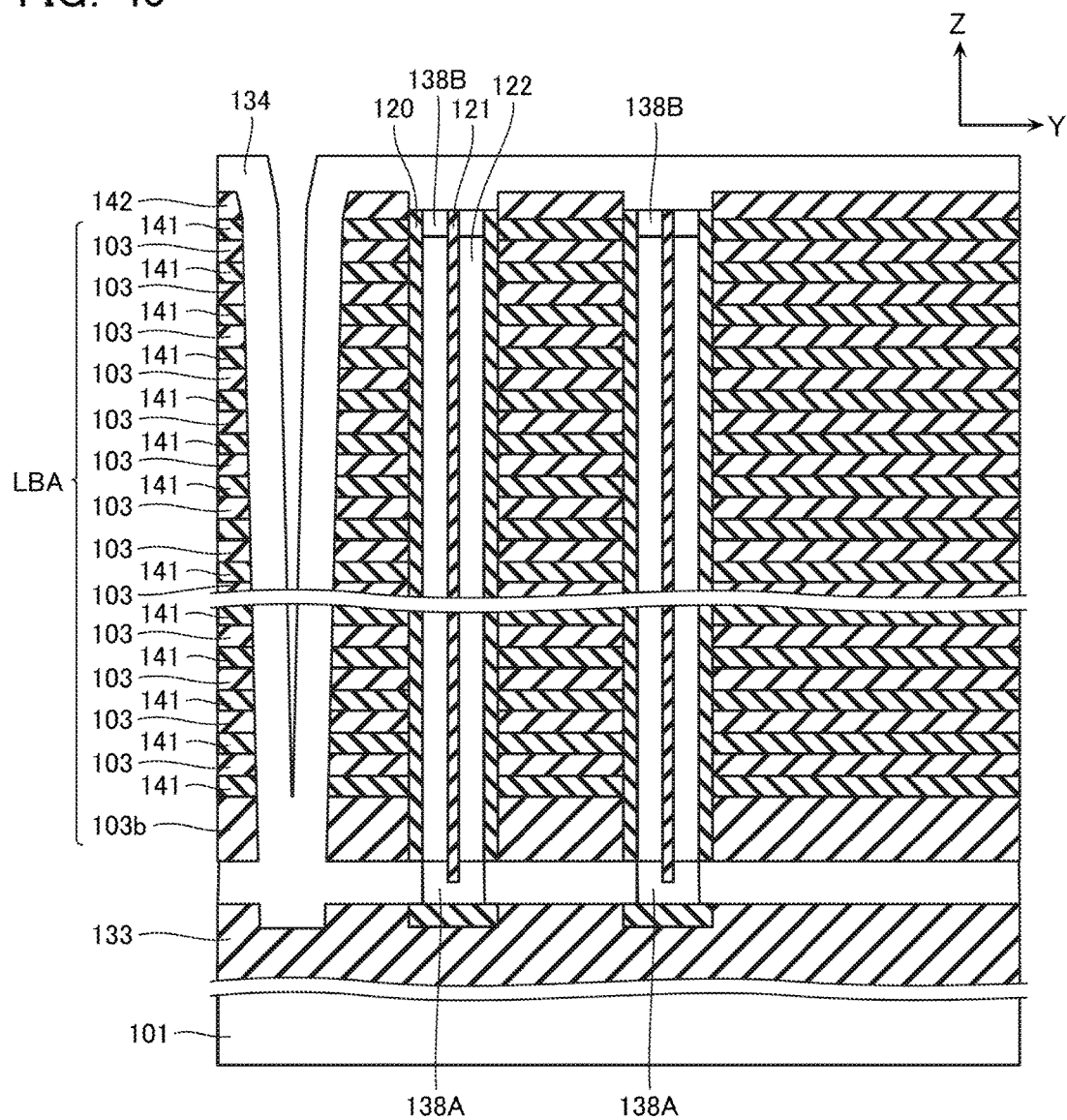
FIG. 40 is a cross-sectional view for describing the same method of manufacturing.

As shown in FIG. 40, a silicon layer 134' is deposited in the opening op5. The silicon layer 134' is configured from doped amorphous-state silicon, for example.

Figure 41:
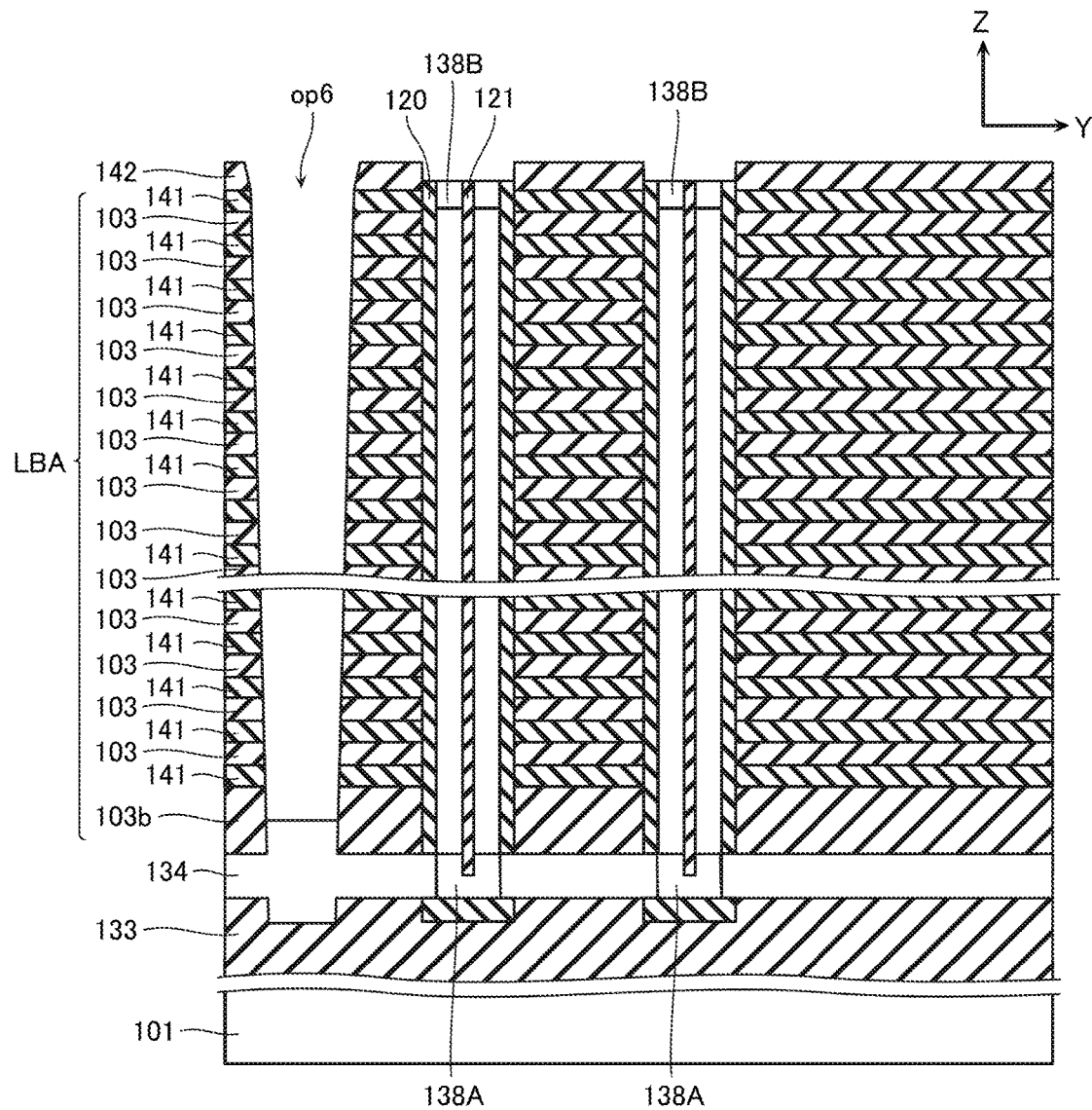
FIG. 41 is a cross-sectional view for describing the same method of manufacturing.

As shown in FIG. 41, part of the silicon layer 134' is removed to form an opening op6. This step is performed by isotropic etching, for example. In this step, only a portion covering an upper surface and a side surface of the laminated body LBA, of the silicon layer 134' is removed, leaving a portion provided between the inter-layer insulating layer 133 and the inter-layer insulating layer 103b, of the silicon layer 134'. In this way, the semiconductor layer 134 contacting a lower end side surface of the semiconductor layer 122 is formed.

Figure 42:
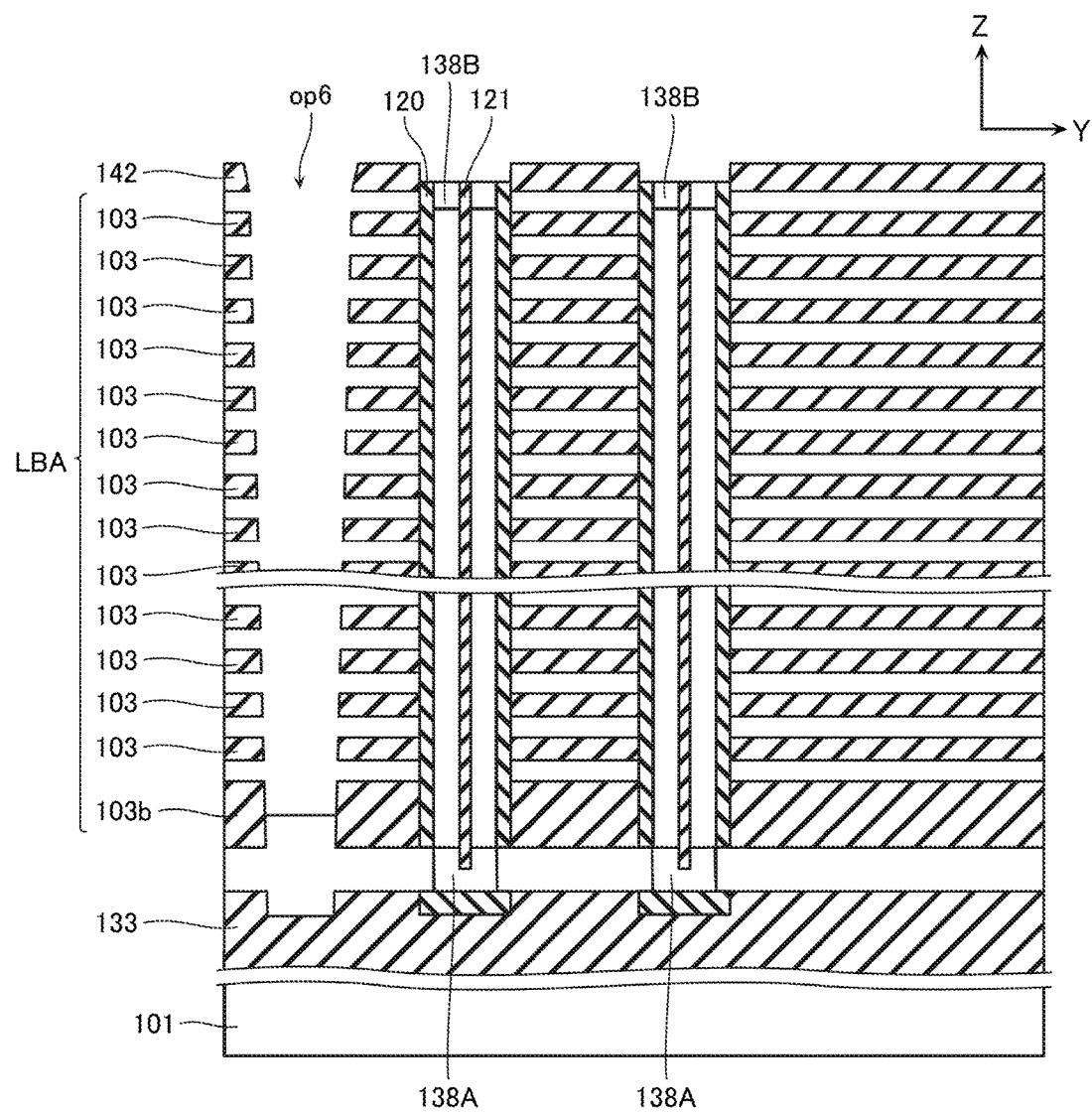
FIG. 42 is a cross-sectional view for describing the same method of manufacturing.

As shown in FIG. 42, the sacrifice layer 141 is removed via the opening op6, similarly to in a step shown in FIG. 24 of the first embodiment.

Then, steps such as formation of the conductive layer 102 and formation of the spacer insulating layer 112 and the conductive layer 108 are undergone, whereby the configuration of the semiconductor memory device shown in FIGS. 25 to 26B is obtained.

[Advantages]

Even in the present embodiment, similarly to in the first embodiment, the crystal structure of the semiconductor layer 122 functioning as the channel body of the memory cell can be configured as a structure, close to a single crystal structure, in which crystal grains of large grain diameter congregate, hence even better cell characteristics can be achieved.

That is, by reforming the semiconductor layer 122 by the MILC method, a crystal grain boundary by which movement of electrons is hindered becomes smaller and mobility can be significantly improved, compared to in polysilicon.

Moreover, due to the present embodiment, processing by the MILC method is performed from both the lower end and the upper end of the semiconductor layer 122, hence it becomes possible for processing time to be shortened more outstandingly than in processing by a conventional MILC method.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of control gate electrodes arranged in a first direction, the first direction intersecting a surface of a substrate;
a first semiconductor layer extending in the first direction and facing side surfaces of the plurality of the control gate electrodes in a second direction, the second direction intersecting the first direction; and
a gate insulating layer provided between the control gate electrode and the first semiconductor layer,
the first semiconductor layer including:
a first portion extending from an end section on a substrate side of the first semiconductor layer to a central region in the first direction of the first semiconductor layer; and
a second portion positioned further from the substrate than the first portion of the first semiconductor layer, and
the first portion having a first crystal plane orientation; and
the second portion having a second crystal plane orientation which is different from the first crystal plane orientation.

2. A semiconductor memory device comprising:
a plurality of control gate electrodes arranged in a first direction, the first direction intersecting a surface of a substrate;
a first semiconductor layer extending in the first direction and facing side surfaces of the plurality of the control gate electrodes in a second direction, the second direction intersecting the first direction; and
a gate insulating layer provided between the control gate electrode and the first semiconductor layer,
the first semiconductor layer including:
a first portion having a first crystal plane orientation; and
a second portion having a second crystal plane orientation which is different from the first crystal plane orientation, and
each of the first portion and the second portion facing at least one of the side surfaces of the control gate electrodes.

3. The semiconductor memory device according to claim 1, further comprising:
a second semiconductor layer provided on the substrate; and
a third semiconductor layer provided between the second semiconductor layer and the end section on the substrate side of the first semiconductor layer.

4. The semiconductor memory device according to claim 3, wherein
a crystal grain included in the third semiconductor layer is smaller than a crystal grain included in the first semiconductor layer.

5. A semiconductor memory device comprising:
a plurality of control gate electrodes arranged in a first direction, the first direction intersecting a surface of a substrate;
a first semiconductor layer extending in the first direction and facing side surfaces of the plurality of the control gate electrodes in a second direction, the second direction intersecting the first direction; and
a gate insulating layer provided between the control gate electrode and the first semiconductor layer,
the first semiconductor layer including:
a first portion having a first crystal plane orientation; and
a second portion having a second crystal plane orientation which is different from the first crystal plane orientation, and
a metal atom exists at a boundary of the first portion and the second portion.

6. The semiconductor memory device according to claim 5, wherein
the metal atom is at least one of nickel, cobalt, copper, or palladium.

7. The semiconductor memory device according to claim 3, wherein
the second semiconductor layer is an epitaxial silicon layer, and the third semiconductor layer is a polysilicon layer.

8. The semiconductor memory device according to claim 3, wherein
the second semiconductor layer is a doped polysilicon layer provided above the substrate, and the third semiconductor layer is a polysilicon layer provided between an end section of the second semiconductor layer and the end section on the substrate side of the first semiconductor layer.

9. The semiconductor memory device according to claim 1, wherein
the gate insulating layer includes a charge accumulation layer.

10. A semiconductor memory device, comprising:
a plurality of control gate electrodes arranged in a first direction, the first direction intersecting a surface of a substrate;
a first semiconductor layer extending in the first direction and facing the plurality of the control gate electrodes from a second direction, the second direction intersecting the first direction; and
a gate insulating layer provided between the control gate electrode and the first semiconductor layer,
the first semiconductor layer comprising: a first portion extending in the first direction; and a second portion extending in the first direction and being provided in a position further from the substrate than the first portion,
crystal grains in the first portion having a first crystal plane orientation, and crystal grains in the second portion having a second crystal plane orientation which is different from the first crystal plane orientation.

11. The semiconductor memory device according to claim 10, wherein
the first portion and the second portion each include crystal grains which are larger than a film thickness in the second direction of the first semiconductor layer.

12. The semiconductor memory device according to claim 10, further comprising:
a second semiconductor layer provided on the surface of the substrate and having a single crystal structure; and
a third semiconductor layer provided between the first semiconductor layer and the second semiconductor layer,
wherein the third semiconductor layer includes a crystal grain which is smaller than a crystal grain in the first semiconductor layer.

13. The semiconductor memory device according to claim 10, wherein
the first semiconductor layer further comprises a third portion provided between the first portion and the substrate, and
the third portion includes a crystal grain which is smaller than a crystal grain in the first portion.

14. The semiconductor memory device according to claim 13, further comprising
a first wiring line provided between the substrate and the plurality of control gate electrodes,
wherein the first wiring line is connected to the third portion of the first semiconductor layer from the second direction.

15. The semiconductor memory device according to claim 10, further comprising
a first insulating layer extending in the first direction and contacting from the second direction the first portion and the second portion of the first semiconductor layer.

16. The semiconductor memory device according to claim 10, wherein
a metal atom exists at a boundary of the first portion and the second portion.

17. The semiconductor memory device according to claim 16, wherein
the metal atom of nickel, cobalt, copper, or palladium exists in the first semiconductor layer.

18. The semiconductor memory device according to claim 10, wherein
the gate insulating layer includes a charge accumulation layer.

19. A semiconductor memory device, comprising:
a plurality of control gate electrodes arranged in a first direction, the first direction intersecting a surface of a substrate;
a first semiconductor layer extending in the first direction and facing side surfaces of the plurality of the control gate electrodes in a second direction, the second direction intersecting the first direction;
a second semiconductor layer provided on the substrate and having a recessed section covering an end section on a substrate side of the first semiconductor layer; and
a third semiconductor layer provided between the recessed section of the second semiconductor layer and the end section on the substrate side of the first semiconductor layer; and
a gate insulating layer provided between the control gate electrode and the first semiconductor layer, the gate insulating layer extending in the first direction and including an end surface that faces the second semiconductor layer,
the first semiconductor layer including:
a first portion having a first crystal plane orientation; and
a second portion having a second crystal plane orientation which is different from the first crystal plane orientation, wherein
the third semiconductor layer includes an extending section extending in the first direction, the extending section contacting each of an inner side surface of the recessed section of the second semiconductor layer, a side surface of the end section on the substrate side of the first semiconductor layer, and the end surface of the gate insulating layer.

* * * * *